(12) United States Patent
Asai et al.

(10) Patent No.: US 6,256,869 B1
(45) Date of Patent: *Jul. 10, 2001

(54) ELECTRONIC-COMPONENT MOUNTING SYSTEM

(75) Inventors: Koichi Asai, Nagoya; Toshimitsu Oka, Kuwana, both of (JP)

(73) Assignee: Fuji Machine Mfg. Co., Ltd., Chiryu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/900,704

(22) Filed: Jul. 25, 1997

(30) Foreign Application Priority Data

Jul. 30, 1996 (JP) ................................... 8-200684
Jul. 30, 1996 (JP) ................................... 8-200685

(51) Int. Cl.[7] .................................................. H05K 3/30
(52) U.S. Cl. ............................... 29/740; 29/739; 29/759; 29/760; 901/16; 901/22; 414/752.1; 198/468.01; 198/468.9; 198/474.1
(58) Field of Search .............................. 29/740, 741, 759, 29/760, 739; 901/16, 22; 414/752.1; 198/468.01, 468.9, 474.1

(56) References Cited

U.S. PATENT DOCUMENTS

| 4,346,514 | * | 8/1982 | Makizawa et al. | ................ | 29/740 |
| 4,595,335 | * | 6/1986 | Takahashi et al. | ................ | 414/744 R |
| 4,951,240 | * | 8/1990 | Fukino | ................ | 29/759 X |
| 5,218,753 | * | 6/1993 | Suzuki et al. | ................ | 29/759 X |
| 5,540,535 | * | 7/1996 | Hamuro et al. | ................ | 29/759 X |
| 5,743,005 | * | 4/1998 | Nakao et al. | ................ | 29/740 X |
| 5,758,558 | * | 6/1998 | Squires | ................ | 83/522.18 |

\* cited by examiner

Primary Examiner—Lee Young
Assistant Examiner—Rick Kiltae Chang
(74) Attorney, Agent, or Firm—Oliff & Berridge, PLC

(57) ABSTRACT

An electronic-component mounting system, including a printed-circuit-board supporting device which positions and supports a printed circuit board, a movable table which is movable, relative to the printed-circuit-board supporting device, in at least one of an X direction and a Y direction which are perpendicular to each other and cooperate with each other to define an X-Y plane parallel to a board-support plane on which the printed circuit board is supported by the supporting device, an electronic-component supplying device which is mounted on the movable table and which includes a component-supply portion from which electronic components are supplied one by one, and an electronic-component mounting device which is mounted on the movable table together with the electronic-component supplying device and which receives the electronic components one by one from the component-supply portion of the supplying device and mounts at least one of the electronic components on the printed circuit board positioned and supported on the component-support plane by the printed-circuit-board supporting device.

21 Claims, 12 Drawing Sheets

ELECTRONIC-COMPONENT MOUNTING SYSTEM

BACKGROUND OF THE INVENTION

1. Field of the Invention

The present invention relates to an electronic-component ("EC") mounting system which mounts an EC on a printed circuit board ("PCB"), a method of mounting an EC on a PCB, and a PCB supporting and positioning apparatus, and in particular to at least one of the art of simplifying the construction of the EC mounting system and the art of improving the efficiency of mounting of ECs.

2. Related Art Statement

Many EC mounting systems include an EC supplying apparatus, an EC mounting apparatus, and a PCB supporting apparatus. The EC mounting apparatus takes an EC from the EC supplying apparatus, conveys the EC to a position above an EC-fix place on a PCB, and mounts the EC at the EC-fix place on the PCB. For example, the EC mounting apparatus includes a movable member which is movable in two directions normal to each other in a horizontal plane (hereinafter, referred to as the "X" direction and the "Y" direction); and a component mounting head which is provided on the movable member such that the mounting head is movable in a vertical direction (hereinafter, referred to as the "Z" direction). The component mounting head which is movable in the X, Y, and Z directions takes an EC from a component-supply portion of the EC supplying apparatus and mounts the EC on the EC-fix place on the PCB supported by the PCB supporting apparatus.

Conventionally, the EC supplying apparatus, the EC mounting apparatus, and the EC supporting apparatus are provided on a common bed, such that those apparatuses are immovable relative to one another on the common bed. Only respective movable members of those apparatuses, such as the movable member and the component mounting head of the EC mounting apparatus, are moved to mount an EC on a PCB.

However, many problems arise from the above-identified facts that the EC supplying apparatus, the EC mounting apparatus, and the EC supporting apparatus are fixed on the common bed and are not movable relative to one another. For example, since the relative position between the EC supplying apparatus and the EC supporting apparatus cannot be changed, ECs cannot be mounted at different EC-fix places on different sorts of PCBs, respectively, by the component mounting head unless the mounting head can be moved in the X and Y directions to various positions corresponding to those different EC-fix places, respectively. To this end, a moving device which moves the component mounting head in one of the X and Y directions must be provided on the movable member which is movable in the other of the X and Y directions. This moving device suffers from complicated construction and increased weight and accordingly cannot be moved at high speed. This leads to lowering the efficiency of mounting of ECs. In addition, the distance between the component-supply portion of the EC supplying apparatus and each EC-fix place may increase, which needs a longer time to mount an EC at said each EC-fix place.

SUMMARY OF THE INVENTION

It is an object of the invention to provide an EC mounting system wherein an EC supplying device and an EC mounting device are mounted on a common movable table and are movable altogether relative to a PCB supporting device.

It is another object of the invention to provide an EC mounting system wherein an EC supplying device and an EC mounting device are movable relative to a PCB supporting device in two directions which are perpendicular to each other and parallel to a board-support plane on which a PCB is supported by the PCB supporting device.

It is another object of the invention to provide an EC mounting system wherein an EC supplying device and an EC mounting device are movable relative to a PCB supporting device so that respective positions of the EC supplying and mounting devices relative to the PCB supporting device can be adjusted before an EC mounting operation is started.

It is another object of the invention to provide an EC mounting system wherein an EC supplying device and an EC mounting device are movable relative to a PCB supporting device by manual operation of an operator.

It is another object of the invention to provide an EC mounting system wherein an EC mounting device includes a component mounting head which is linearly reciprocated between an EC supplying device and a PCB supporting device for mounting ECs on PCBs.

It is another object of the invention to provide an EC mounting system wherein a PCB supporting device includes a PCB conveying device which conveys a PCB, stops it at a predetermined stop position with accuracy, and positions it at the stop position.

It is another object of the invention to provide an EC mounting system which stops a PCB at each of a plurality of positions and positions the PCB at said each position.

It is another object of the invention to provide an EC mounting system which includes a device which stops a PCB at each of a plurality of positions and which is produced at low cost.

It is another object of the invention to provide an EC mounting method in which respective positions of an EC supplying device and an EC mounting device relative to a PCB supporting are adjusted relative to an EC-fix place on a PCB before an EC is mounted at the EC-fix place on the PCB, so that ECs are mounted on PCBs with high efficiency.

It is another object of the invention to provide a PCB supporting and positioning apparatus which supports a PCB and positions the PCB at each of a plurality of positions.

The present invention provides an EC mounting system, an EC mounting method, and a PCB supporting and positioning apparatus which have one or more of the technical features which are described below in respective paragraphs given parenthesized sequential numbers (1) to (33). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of a first aspect of the present invention, there is provided an electronic-component mounting system, comprising a printed-circuit-board supporting device which positions and supports a printed circuit board; a movable table which is movable, relative to the printed-circuit-board supporting device, in at least one of an X direction and a Y direction which are perpendicular to each other and cooperate with each other to define an X-Y plane parallel to a board-support plane on which the printed circuit board is supported by the supporting device; an electronic-component supplying device which is mounted on the movable table and which includes a component-supply portion from which electronic components are supplied one by one; and an electronic-component mounting device which is mounted on the movable table together with the electronic-component supplying device and which receives the electronic components one by one from the component-supply portion of the supplying device and mounts at least one of the electronic components on the printed circuit board positioned and supported on the component-support plane by the printed-circuit-board supporting device. In the present electronic-component ("EC") mounting system, the EC supplying device and the EC mounting device are provided with accuracy at respective places on the movable table. Therefore, respective positions of the EC supplying and mounting devices relative to the PCB supporting device can be changed altogether, without causing any change of the relative position between the EC supplying and mounting devices, by movement of the movable table. The movable table may be one which is movable in both the X and Y directions, or one which is movable in only one of the X and Y directions. In either case, the movable table may be one which is manually moved by an operator, or one which is mechanically moved by a drive source such as an electric motor. In the case where the movable table is moved by a drive source, the drive source may be a servomotor whose rotation amount can be controlled with accuracy so that the table can be moved to any desired position with accuracy, or otherwise a common electric motor other than the servomotor. In the latter case, a sensor and a stopper may be employed for stopping the movable table at a desired position. The movable table may be adapted such that the table is fully automatically moved by the drive source, or such that the table is moved by the drive source under control of the operator. The EC mounting device may be one which is movable in both the X and Y directions, one which is movable in only one of the X and Y directions, or one which is movable in one or more directions which intersects or intersect the X and Y directions. In any case, the EC mounting device may employ one of various drive sources, such as a fluid-pressure-operated cylinder device, a servomotor, or a common electric motor other than the servomotor, for conveying an EC. Thus, each of the movable table and the EC mounting device may be embodied in various manners, and the present EC mounting system may be embodied in various manners by combining the various manners of embodying of the movable table and those of embodying of the EC mounting device. For example, in the case where the movable table is manually movable by the operator in both the X and Y directions and the EC mounting device employs a fluid-pressure-operated cylinder device for conveying ECs through a straight route having a predetermined length in the Y direction perpendicular to the X direction in which a PCB is conveyed by the PCB supporting device, the EC mounting device can enjoy a simple construction and can quickly mount ECs on PCBs. Even if a sort of PCB having an EC-fix place at which EC is to be mounted may be followed by a different sort of PCB having a different EC-fix place, the distance between the different EC-fix place on the different sort of PCB and the EC supplying and mounting devices can be adjusted by moving the movable table by a distance equal to the distance between the respective EC-fix places of the two PCBs. Simultaneously, the different EC-fix place and the component-supply portion of the EC supplying device can be positioned at opposite ends of the above-indicated straight route having the predetermined length, respectively. Thus, the movement of the table can eliminate the effects resulting from the difference of respective EC-fix places of different sorts of PCBs. Accordingly, the EC mounting device has only to repeat the same EC conveying operation, i.e., conveys an EC through the straight route from the component-supply portion of the EC supplying device to the different EC-fix place, for mounting the EC at the different EC-fix place on the different sort of PCB. In addition, since the EC mounting device has only to convey an EC in one direction (i.e., the Y direction) for mounting the EC on a PCB, it can employ an EC conveying device which has a small weight or mass and which accordingly can be moved at high speed and can quickly mount the EC on the PCB. If the distance between the component-supply portion of the EC supplying device and the EC-fix place of each of PCBs does not change among the PCBs, the EC mounting device may employ a swingable arm which is swingable about an axis line, for conveying an EC, as will be described on a preferred embodiment of the present invention. In this case, too, the EC mounting device can enjoy a simple construction. In the case where the movable table can automatically be moved to any position by a servomotor in both the X and Y directions, the EC supplying and mounting devices may be adapted such that those devices can automatically be moved relative to the PCB supporting device, and the EC mounting device may be adapted such that the mounting device can automatically be reciprocated through a straight route having a predetermined length, so that ECs can automatically and quickly be mounted at respective EC-fix places on PCBs. In the case where the EC supplying and mounting devices can be moved altogether relative to the PCB supporting device while the EC mounting device receives an EC from the EC supplying device and conveys the EC, a plurality of ECs can be mounted with high efficiency at a plurality of EC-fix places on a single PCB. In the case where the movable table is manually movable by the operator in both the X and Y directions and the EC mounting device is movable by a servomotor in both the X and Y directions, the distance over which ECs are conveyed can be reduced. As will be described on a preferred embodiment of the invention, the EC supplying device may be provided on the movable table together with the EC mounting device such that those devices can be moved to a position right above the PCB by the movement of the table, and the EC mounting device may be adapted such that the mounting device can convey an EC within a predetermined range which assures that the EC is mounted in one of sub-areas obtained by dividing an EC-mount area on a PCB. More specifically described, when an EC is mounted on a PCB, the component-supply portion of the EC supplying device and the EC mounting device are moved to a position near that one sub-area by the movement of the table, and the EC mounting device conveys the EC from the component-supply portion to an EC-fix place on the PCB and mounts the EC at the EC-fix place. The distance between the component-supply portion and the EC-fix place can be reduced to a value smaller than the entire dimension of the PCB, and accordingly the EC can quickly be mounted at any position within the sub-area on the PCB. Thus, even if the range within which the EC mounting device can convey ECs may be smaller than the dimension of the PCB, the movable table can be moved, and accordingly the EC supplying and mounting devices can be moved, to a position where the EC mounting device can convey an EC to the PCB and mount the EC on the PCB. Thus, an EC can quickly be mounted in any small sub-area on a PCB. In the case where a plurality of EC-fix places are arranged in only one of the X and Y directions within a sub-area on a PCB, the EC mounting device may be one which is movable in only that one direction by a servomotor. In this case, the EC mounting device can enjoy a simple construction and a small weight or mass, and can quickly convey an EC and mount the EC on a PCB. The movable table may be one which can be moved by a servomotor to any position in only one of the X and Y directions, and the EC mounting device may one which can be moved by a servomotor as a drive source to any position in only one of the X and Y directions so as to convey an EC. In the case where the direction of movement of the table is normal to that of the EC mounting device, an EC can accurately be mounted at an EC-fix place on a current PCB by respective movements of the table and the EC mounting device which compensate for the X-direction and Y-direction differences or distances of the EC-fix place on the current PCB from that on the prior PCB. Thus, the distance of conveying of ECs can be reduced. Unless the EC supplying device can be moved with the EC mounting device when the movable table is moved, the EC mounting device must be moved in both the X and Y directions. In contrast, since the position of the component-supply portion of the EC supplying device relative to the EC-fix place can be adjusted in one direction by the movement of the table, the distance and time of EC conveying of the EC mounting device can be reduced as such. That is, ECs can quickly be mounted on PCBs. The movable table may be one which is manually movable in either one of the X and Y directions and the EC mounting device may be one which is movable in the same direction as that in which the table is movable. If a first PCB having an EC-fix place is followed by a second PCB having a different EC-fix place, the movable table is moved to adjust the respective positions of the EC supplying and mounting devices relative to the PCB supporting device, and the second PCB is stopped by the PCB supporting device at a selected position different from the position where the first PCB is stopped by the same, in a direction different from the direction in which the table is moved. Thus, an EC can be mounted at any position on a PCB by the EC mounting device which is reciprocated through a straight route having a predetermined length. Since the second PCB is stopped at a selected position different from the position where the first PCB is stopped, the difference of the EC-fix place of the second PCB from that of the first PCB in the direction in which the PCB is conveyed and stopped, is eliminated. As will be described on a preferred embodiment of the invention, the EC supplying device may be one of various devices, in particular, one which includes a tape cartridge which intermittently feeds an EC tape carrying a number of ECs at a regular interval, at a feeding pitch equal the regular interval; one which includes a tilted container in which a number of ECs are arranged in an array, and a feeder which supplies the ECs one by one to a component-supply portion by utilizing the tilting of the container; or one which includes a container in which a number of ECs are stored, and a feeder which includes a vibrator for vibrating the container and thereby making the ECs into an array and supplies the ECs one by one to a component-supply portion. In the case where the EC supplying device includes a tape cartridge, the cartridge may include a main body to which an EC tape which is wound around a supply reel is attached, or to which an EC tape which is stored in a tape storage case is attached. The EC supplying device may be one which includes only one component-supply portion or one which includes a plurality of component-supply portions. For example, the EC supplying device may include a plurality of tape cartridges such that the respective component-supply portions of the cartridges are arranged along a straight line. In this case, the EC supplying device may be moved in a direction parallel to the straight line, so that the EC mounting device can take, at predetermined position, ECs from the component-supply portions of the cartridges. The EC mounting device may employ a component sucking head which sucks an EC by vacuum, or a chuck having a plurality of grasping hands which open and close to grasp an EC and again open to release the EC. As is apparent from the foregoing description, in the present EC mounting system, the EC supplying device and the EC mounting device are mounted on the common movable table, so that the respective positions of those two devices relative to the PCB supporting device can be changed altogether. Therefore, the EC mounting system is free from at least one of the previously-identified problems with the conventional EC mounting systems. Since the EC supplying and mounting devices are provided on the common movable table, the present EC mounting system enjoys a simpler construction and a lower production cost as compared with the case where the two devices are mounted on separate tables, respectively, and are moved independent of each other. In addition, the respective positions of the two devices relative to the PCB supporting device can be changed with ease and at high speed. Moreover, even if there may be positioning errors and/or assembling errors between the EC supplying and mounting devices and the PCB supporting device, those errors can be removed by changing the relative position between the EC supplying and mounting devices and the PCB supporting device by moving the movable table relative to the PCB supporting device.

(2) According to a second feature of the invention which includes the first feature (1), the movable table comprises an X-Y table which is movable in both the X and Y directions. In the present EC mounting system, the EC supplying and mounting devices can be moved, by an appropriate movement of the X-Y table, to any position on the X-Y plane parallel to the board-support plane of the PCB supporting device. Therefore, as described above, an EC may be conveyed through a straight route having a predetermined length, so that the EC is quickly mounted on a PCB. Alternatively, a plurality of ECs may be conveyed over a shortened distance so that the ECs are quickly mounted at a plurality of EC-fix places within a limited area on a PCB.

(3) According to a third feature of the invention which includes the second feature (2), the X-Y table comprises an X-direction slider which is movable in the X direction relative to a bed; an X-direction clamper which clamps the X-direction slider relative to the bed; an Y-direction slider which is movable in the Y direction relative to the X-direction slider; and an Y-direction clamper which clamps the Y-direction slider relative to the X-direction slider. In the present EC mounting system, the X-Y table can be moved to a desired position, before an EC mounting operation is started, so as to change the respective positions of the EC supplying and mounting devices relative to the PCB supporting device. The X-Y table is clamped at the desired position by the X-direction and Y-direction clampers. The two clampers may be manually operable clampers, or automatically operable clampers each of which includes a clamping member and a switching device for switching the clamping member to an operative position where the clamping member clamps a corresponding slider and to an inoperative position where the clamping member does not clamp the slider.

(4) According to a fourth feature of the invention which includes the third feature (3), the EC mounting system further comprises an X-direction nut which is supported by one of the X-direction slider and the bed; an X-direction feeding screw which is supported by the other of the X-direction slider and the bed and which is threadedly engaged with the X-direction nut to move the X-direction slider in the X direction by rotation of the X-direction feeding screw relative to the X-direction nut; an Y-direction nut which is supported by one of the Y-direction and X-direction sliders; a Y-direction feeding screw which is supported by the other of the Y-direction and X-direction sliders and which is threadedly engaged with the Y-direction nut to move the Y-direction slider in the Y direction by rotation of the Y-direction feeding screw relative to the Y-direction nut. In the present EC mounting system, the X-Y table can be moved to a desired position on the X-Y plane by the two pairs of feeding screw and nut. The X-direction feeding screw may be supported by the X-direction slider and the X-direction nut may be supported by the bed, or vice versa. The Y-direction feeding screw may be supported by the X-direction slider and the Y-direction nut may be supported by the Y-direction slider, or vice versa. One or both of the X-direction or Y-direction feeding screw and the X-direction or Y-direction nut may be rotated. The X-direction or Y-direction feeding screw and/or the X-direction or Y-direction nut may be rotated either manually by the operator, or mechanically by a drive source such as an electric motor. In the case where the screw and/or nut are/is manually rotated, the mounting system does not need any drive sources for moving the X-Y table, which contributes to reducing the production cost of the mounting system. On the other hand, in the case where the screw and/or nut are/is rotated by one or more drive sources, the X-Y table can automatically be moved in the X and Y directions. This assures that all the steps including changing the respective positions of the EC supplying and mounting positions relative to the PCB supporting device, and mounting ECs on PCBs can be fully automated.

(5) According to a fifth feature of the invention which includes the fourth feature (4), the X-direction feeding screw comprises a manually rotatable X-direction feeding screw which is supported by the bed such that the manually rotatable X-direction feeding screw is rotatable about the axis line thereof and is immovable in an axial direction thereof and which is manually rotatable about the axis line thereof by an operator, and wherein the Y-direction feeding screw comprises a manually rotatable Y-direction feeding screw which is supported by the bed such that the manually rotatable Y-direction feeding screw is rotatable about the axis line thereof and is immovable in an axial direction thereof and which is manually rotatable about the axis line thereof by the operator. Since the X-direction feeding screw is provided on the bed, the position of the screw does not change when the X-direction nut is moved with the X-direction slider. This facilitates the operator's job. Since the Y-direction feeding screw is provided on the X-direction slider, the position of the screw changes when the X-direction slider is moved. However, so long as the X-direction slider remains stopped, the operator can rotate the Y-direction screw at a fixed position thereof corresponding to the position where the X-direction slider is stopped. Generally, in the case where a slider is moved by using a feeding screw and a nut, it is easier to rotate the screw than to rotate the nut. The screw can be rotated by directly engaging a tool with one of opposite ends of the screw and then rotating the tool. On the other hand, it is difficult to rotate directly the nut, and a rotary-motion transmitting device must be employed to transmit a rotary motion to the nut. In addition, in the present EC mounting system, the two nuts and one of the two screws are moved relative to the bed. Since those have a smaller total weight or mass than the total mass of the two screws and one of the two screws, each of the two sliders generates only lower vibration.

(6) According to a sixth feature of the invention which includes any one of the first to fifth feature (1) to (5), the electronic-component mounting device comprises a head guide which extends between the component-supply portion of the electronic-component supplying device and the printed-circuit-board supporting device along a straight line parallel to the X-Y plane; a component mounting head which is supported by the head guide such that the component mounting head is movable relative to the head guide; and a fluid-pressure-operated cylinder device which moves the component mounting head, along the head guide, to a component receiving position corresponding to the component-supply portion of the supplying device and to a component mounting position corresponding to a component-fix place on the printed circuit board supported by the printed-circuit-board supporting device. In the present EC mounting system, the component mounting head is reciprocated through a straight route between the component receiving position and the component mounting position, for mounting ECs on PCBs. Thus, the component mounting head can be moved within a reduced space, which contributes to reducing the overall size of the present EC mounting system. In addition, since the mounting head is moved by the fluid-pressure-operated cylinder device, the EC mounting device can be produced at low cost. The component receiving and mounting positions may be defined by opposite stroke ends of a piston of the cylinder device, respectively. Otherwise, one or more stoppers may be employed for stopping the movement of the piston at one or more positions intermediate between the two opposite stroke ends of the piston, respectively. In this case, two or more component mounting positions may be defined. The stopper or each of the stoppers is movable to an operative position where the stopper engages a member moved by the cylinder device and thereby stops the movement of the member and to an inoperative position where the stopper does not engage the member. A stopper moving device selectively moves the stopper to the operative and inoperative positions. Alternatively, a plurality of fluid-pressure-operated cylinder devices may be employed, so that a plurality of component mounting positions may be defined by combining the respective operations of the two cylinder devices. The cylinder device or devices may be an air-pressure-operated or pneumatic cylinder or cylinders, or a liquid-pressure-operated or hydraulic cylinder or cylinders. In either case, the EC mounting device can be produced at low cost.

(7) According to a seventh feature of the invention which includes any one of the first to sixth feature (1) to (6), the printed-circuit-board supporting device comprises a board conveying device which conveys the printed circuit board through a board conveying route by utilizing friction thereof with the board; a stopper which engages the printed circuit board conveyed by the board conveying device and thereby stops the movement of the board; a stopper displacing device which displaces the stopper to an operative position thereof where the stopper engages the printed circuit board and stops the movement of the board and to an inoperative position thereof where the stopper does not contact the board; a plurality of positioning pins which fit in a plurality of positioning holes of the printed circuit board stopped by the stopper and thereby position the board; and a positioning-pin displacing device which displaces the positioning pins to an operative position thereof where the positioning pins fit in the positioning holes of the printed circuit board and to an inoperative position thereof where the pins do no fit in the holes of the board. In the present EC mounting system, the PCB is stopped at a predetermined position by the stopper, and positioned with accuracy by the positioning pins. Therefore, the PCB is prevented from being moved out of position because of the vibration exerted thereto after the PCB is stopped and before one or more ECs are mounted thereon. Thus, the EC or ECs is or are mounted with accuracy at predetermined EC-fix positions on the PCB. The direction in which the component mounting head conveys the EC may be either perpendicular or parallel to the direction in which the board conveying device conveys the PCB, or the former direction may obliquely cross over the latter direction. The stopper or the pins may be either rotated or linearly moved to its or their operative and inoperative positions.

(8) According to an eighth feature of the invention which includes the seventh feature (7), the printed-circuit-board supporting device comprises a supporting member which supports the stopper, the stopper displacing device, the positioning pins, and the positioning-pin displacing device and which is movable in a direction parallel to the board conveying route; and a supporting-member moving device which moves the supporting device in the direction parallel to the board conveying route. In the present EC mounting system, the position of the stopper, the stopper displacing device, the positioning pins, and the positioning-pin displacing device in a direction parallel to the board conveying route can be changed by moving the supporting member. Thus, a single PCB may be stopped, and positioned, at each of a plurality of positions which are distant from each other in the direction parallel to the board conveying route. Otherwise, different sorts of PCBs may be stopped and positioned at different positions, respectively, which are distant from each other in the direction parallel to the board conveying route. In the former case, as will be described on a preferred embodiment of the invention, a plurality of ECs may be fixed at a plurality of EC-fix positions, respectively, which are predetermined on a single PCB such that the EC-fix positions are equidistant from each other in a direction parallel to the board conveying direction in which the PCB is conveyed by the board conveying device. After ECs are mounted at all the predetermined EC-fix positions on the PCB, the PCB may be equally divided into a plurality of identical divided PCBs along one or more division lines each perpendicular to the board conveying direction. In this case, the supporting member is moved by a distance equal to the interval between each pair of adjacent EC-fix positions on the PCB. However, in the case where a plurality of ECs are mounted at a plurality of EC-fix positions on a single PCB, respectively, the supporting member may be moved by a distance or distances different from the length obtained by dividing the dimension of the PCB in the direction parallel to the board conveying direction, by the number of the EC-fix positions on the PCB. In this case, the ECs are mounted at the EC-fix positions which are not equidistant from each other on the PCB. If the PCB on which all the ECs are mounted at the EC-fix positions, respectively, is equally divided, different divided PCBs are obtained which, however, have the same dimension the the direction parallel to the board conveying direction. On the other hand, the PCB may be divided into different divided PCBs which have different dimensions corresponding to the distance or distances by which the supporting member is moved. The present EC mounting system may comprise a plurality of component mounting heads each of which conveys an EC in a direction perpendicular to the board conveying direction and which are arranged in an array in the perpendicular direction. In this case, a plurality of ECs may be fixed at a plurality of EC-fix positions, respectively, which are predetermined on a single PCB such that the EC-fix positions are arranged in an array in the perpendicular direction. After the ECs are mounted at all the predetermined EC-fix positions on the single PCB, the PCB may be divided into a plurality of divided PCBs along one or more division lines parallel to the board conveying direction. This dividing operation may, or may not, be combined with the above-indicated dividing operation in which the PCB is divided into a plurality of PCBs along one or more lines perpendicular to the board conveying direction. The supporting-member moving device may comprise a fluid-pressure-operated cylinder device as a drive source, as will be described below, or alternatively comprise an electric motor such as a servomotor which can be controlled with respect to its rotation angle, or otherwise comprise a common electric motor other than the servomotor. In the case where an electric motor which can be controlled with respect to its rotation angle is employed, the supporting member can be moved to any desired position, so that the PCB can be stopped and positioned at any desired position in the board conveying direction. If a plurality of stopper members are employed in addition to the cylinder device, the supporting member can be stopped at each of a plurality of positions by the single cylinder device. Each of the stopper members is moved to its operative and inoperative positions by a corresponding stopper-member moving device comprising, as a drive source, a fluid-pressure-operated cylinder device, for example.

(9) According to a ninth feature of the invention which includes the eighth feature (8), the supporting-member moving device comprises at least one fluid-pressure-operated cylinder device. In this case, the supporting member can be moved to two positions distant from each other along the board conveying route, by moving a piston of the cylinder device between its opposite stroke ends. If a plurality of cylinder devices are employed, the supporting member can be moved to three or more positions distant from each other along the board conveying route. In the case where the single cylinder device is provided between the supporting member and an immovable member which supports the supporting member such that the supporting member is movable, a stopper member may be provided on the immovable member, for stopping the movement of the piston of the cylinder device, at a position between the opposite stroke ends of the piston, so that the supporting member may be stopped at three or more positions along the board conveying route. The fluid-pressure-operated cylinder device may be either a pneumatically operated cylinder device or a hydraulically operated cylinder device. In either case, the supporting-member moving device can be produced at low cost.

(10) According to a tenth feature of the invention which includes the ninth feature (9), the supporting-member moving device comprises a movable member which is movable in a direction parallel to the direction in which the supporting member is movable; a supporting-member-related fluid-pressure-operated cylinder device which is provided between the movable member and the supporting member and which moves the supporting member relative to the movable member; and a movable-member-related fluid-pressure-operated cylinder device which is provided between the movable member and an immovable member and which moves the movable member relative to the immovable member. In the present system, the supporting member can be moved to a plurality of positions corresponding to a plurality of combinations of a plurality of operating states of one of the two cylinder devices and a plurality of operating states of the other cylinder device. The supporting-member moving device may further comprise another movable member which is movable relative to the movable member in the direction parallel to the direction of movement of the supporting member, and another movable-member-related fluid-pressure-operated cylinder device which is provided between the two movable members. In the latter case, the supporting member can be moved to still more positions along the board conveying direction.

(11) According to an eleventh feature of the invention which includes the tenth feature (10), the supporting-member moving device further comprises a guide member which commonly guides the supporting member and the movable member. The present EC mounting system enjoys a simplified construction.

(12) According to a twelfth feature of the invention which includes the eleventh feature (11), the supporting member and the movable member at least partly overlap each other in a direction parallel to the guide member. In the case where the supporting member and the movable member are movably supported by the common guide member such that the two members partly overlap each other in the direction parallel to the guide member, the two members commonly use a portion of the guide member, which contributes to shortening the overall length of the guide member in the longitudinal direction thereof and elongating respective portions of the two members which are supported by the guide member. As will be described on a preferred embodiment of the invention, in the case where each of the supporting member and the movable member is supported at two portions thereof distant from each other in the direction of movement thereof, by the guide member, the two portions of the movable member may be positioned between, or alternate with, the two portions of the supporting member.

(13) According to a thirteenth feature of the invention which includes the twelfth feature (12), one of the respective overlapping portions of the supporting member and the movable member has an opening, and the supporting-member moving device further comprises a connecting projection which projects from the other of the respective overlapping portions and extends through the opening from one side of the one overlapping portion to the other side thereof, the movable-member-related fluid-pressure-operated cylinder device being connected to the connecting projection and one of the supporting member and the movable member which includes the one overlapping portion having the opening. In this case, one end of the movable-member-related fluid-pressure-operated cylinder device whose other end is connected to one of the supporting member and the movable member is connected to a portion of the other of the supporting member and the movable member which overlaps said one of the supporting member and the movable member and which is opposite to the cylinder device.

(14) According to a fourteenth feature of the invention which includes any one of the seventh to thirteenth features (7) to (13), the board conveying route comprises a straight route parallel to one of the X and Y directions, and the electronic-component mounting device comprises a component-mounting-head guide which extends between the component-supply portion of the electronic-component supplying device and the printed-circuit-board supporting device along a straight line parallel to the other of the X and Y directions.

(15) According to a fifteenth feature of the invention which includes any one of the seventh to thirteenth features (7) to (14), the stopper comprises a swingable stopper which is swingable to the operative and inoperative positions thereof about an axis line parallel to the X-Y plane, and wherein the stopper displacing device comprises a stopper swinging device which swings the swingable stopper to the operative and inoperative positions thereof. The axis line about which the swingable stopper is swingable may be parallel to the board conveying direction, or perpendicular to the board conveying direction in the X-Y plane.

(16) According to a sixteenth feature of the invention which includes any one of the seventh to fifteenth features (7) to (15), the plurality of positioning pins are attached to a plurality of pin supporting arms, respectively, which project from a rotatable shaft rotatable about an axis line parallel to the X-Y plane and which are swung when the rotatable shaft is rotated, the positioning pins being swung to the operative and inoperative positions thereof when the pin supporting arms are swung, and wherein the positioning-pin displacing device comprises a rotatable-shaft rotating device which rotates the rotatable shaft. The axis line about which the rotatable shaft is rotatable may be parallel to the board conveying direction, or perpendicular to the board conveying direction in the X-Y plane.

(17) According to a seventeenth feature of the invention which includes the sixteenth feature (16), at least one of the plurality of pin supporting arms is attached to the rotatable shaft such that a position of the one arm relative to the rotatable shaft in an axial direction of the rotatable shaft is adjustable. Since one or more pin supporting arms is or are adjustable or changeable with respect to its position or their positions, the positioning pins can position each of different sorts of PCBs which have positioning holes at different positions, respectively.

(18) According to an eighteenth feature of the invention which includes any one of the fifth to seventeenth features (5) to (17), the electronic-component mounting device comprises a head holder which holds the component mounting head such that the mounting head is movable in a Z direction perpendicular to the X-Y plane and which is supported by the head guide such that the head holder is movable relative thereto; and a Z-direction moving device which moves the component mounting head relative to the head holder in the Z direction. Although it is possible to move the component mounting head together with the head guide or otherwise it is possible to move the EC supplying device, the present EC mounting system is adapted such that the component mounting head is moved in the Z direction to take an EC from the EC-supply portion of the EC supplying device and mount the EC on the PCB. This arrangement contributes to reducing the mass or weight which is moved for taking and mounting an EC. Therefore, the EC can be quickly mounted on the PCB.

(19) According to a nineteenth feature of the invention which includes any one of the first to fifth features (1) to (5) and the seventh to ninth features (7) to (9), the electronic-component mounting device comprises a swingable arm which is swingable about an axis line parallel to a Z direction perpendicular to the X-Y plane and which supports, at a free end portion thereof, a component mounting head; and a swinging device which swings the swingable arm to a component receiving position where the component mounting head is aligned with the component-supply portion of the supplying device in the Z direction and to a component mounting position where the component mounting head is aligned in the Z direction with a component-fix place on the printed circuit board supported by the printed-circuit-board supporting device.

(20) According to a twentieth feature of the invention which includes the nineteenth feature (19), the swingable arm supports, at the free end portion thereof, the component mounting head such that the component mounting head is movable relative to the swingable arm in the Z direction, and wherein the electronic-component mounting device further comprises a Z-direction moving device which moves the component mounting head relative to the swingable arm in the Z direction. Alternatively, the Z-direction moving device may be modified such that it moves the swingable arm in the Z direction, for indirectly moving the component mounting head in the Z direction.

(21) According to a twenty-first feature of the invention, there is provided a process of mounting electronic components on a printed circuit board, comprising the steps of mounting, on a movable table which is movable, relative to a printed-circuit-board supporting apparatus which positions and supports each of a plurality of printed circuit boards, in at least one of an X direction and a Y direction which are perpendicular to each other and cooperate with each other to define an X-Y plane parallel to a board-support plane on which the each printed circuit board is supported by the printed-circuit-board supporting device, an electronic-component mounting apparatus including a component mounting head which is movable between at least one component receiving position and at least one component mounting position, and an electronic-component supplying apparatus which supplies electronic components one by one to at least one position corresponding to the at least one component receiving position, moving and fixing, before at least one of the electronic components is mounted on the each printed circuit board by the component mounting head, the movable table to, and at, a position thereof where the component mounting position of the component mounting head is aligned with a desired position on the printed-circuit-board supporting device, and iteratively moving, while the printed circuit boards are positioned and supported one by one by the printed-circuit-board supporting device, the component mounting head to the component receiving position thereof where the mounting head receives one of the electronic components from the electronic-component supplying device and to the component mounting position thereof where the mounting head mounts the one component on one of the printed circuit boards which is currently positioned and supported by the supporting device. In the present EC mounting process, the respective positions of the EC mounting device and the EC supplying device can be adjusted or changed before an EC is mounted on a PCB. More specifically described, the EC mounting device and the EC supplying device are mounted on the movable table such that the relative position between the two devices is not changeable, and the movable table is moved to, and fixed at, a position thereof where the component mounting position of the component mounting head is aligned with a desired position on the printed-circuit-board supporting device. Therefore, whatever position may be desired on the PCB supporting device, the component mounting head is moved in the same way between its component receiving and mounting positions, for mounting an EC on a PCB. Thus, in the present process, an EC can be quickly mounted on a PCB using the component mounting head having the simple construction.

(22) According to a twenty-second feature of the invention which includes the twenty-first feature (21), the at least one component receiving position consists of a single component receiving position and the at least one component mounting position consists of a single component mounting position, and wherein the step of iteratively moving the component mounting head comprises iteratively moving the component mounting head between the single component receiving position thereof and the single component mounting position thereof through a predetermined route. The component mounting head is moved along the predetermined route between the predetermined component receiving and mounting positions. Thus, an EC can be quickly mounted on a PCB using the component mounting device having the simple construction.

(23) According to a twenty-third feature of the invention which includes the twenty-first feature (21) or the twenty-second feature (22), the EC mounting process further comprises the step of iteratively moving and stopping the each printed circuit board to, and at, each of a plurality of positions, wherein the step of iteratively moving the component mounting head comprises moving the component mounting head to the component mounting position thereof where the mounting head mounts at least one of the electronic components on the each printed circuit board stopped at the each of the plurality of positions. Thus, a plurality of ECs can be quickly mounted on a single PCB using the component mounting device and the PCB supporting and positioning device each of which has the simple construction.

(24) According to a twenty-fourth feature of the invention, there is provided printed-circuit-board supporting and positioning apparatus for supporting and positioning a printed circuit board, comprising a board conveying device which supports the printed circuit board, and conveys the board through a board conveying route by utilizing friction thereof with the board; a stopper which engages the printed circuit board conveyed by the board conveying device and stops the movement of the board; a stopper displacing device which displaces the stopper to an operative position thereof where the stopper engages the printed circuit board and stops the movement of the board and to an inoperative position thereof where the stopper does not contact the printed circuit board; a plurality of positioning members which cooperate with each other to position the printed circuit board stopped by the stopper; a positioning-member displacing device which displaces the positioning members to an operative position thereof where the positioning members position the printed circuit board and to an inoperative position thereof where the positioning members do not position the printed circuit board; a supporting member which supports the stopper, the stopper displacing device, the positioning members, and the positioning-member displacing device, and which is movable in a direction parallel to the board conveying route; and a supporting-member moving device which moves the supporting member in the direction parallel to the board conveying route. In the present apparatus, when the supporting member is moved by the supporting-member moving device, the stopper, the stopper displacing device, the positioning members, and the positioning-member displacing device are moved altogether, so that the position of those elements in the direction parallel to the board conveying direction is changed. Even if the present apparatus may employ the single combination of the stopper and the stopper moving device and the single combination of the positioning members and the positioning-pin moving device, it can stop the movement of a PCB and position the PCB, at each of a plurality of positions which are distant from each other in the direction parallel to the board conveying route. The present apparatus may sequentially stop and position a single PCB at each of a plurality of positions distant from each other in the direction parallel to the board conveying route, or alternatively may stop and position each of a plurality of sorts of PCBs at a corresponding one of a plurality of positions distant from each other in the direction parallel to the board conveying route. In the former case, when the stopper and the positioning members are moved from one position where they have stopped and positioned the PCB, to the next position where they are to stop and position the PCB, they may be moved either while they are held in their operative positions, or after they are returned to their inoperative positions. In the second case, after the stopper and the members are moved to the next position, they are moved to their operative positions. In the first case, i.e., the stopper and the members are moved while they are held in their operative positions, the PCB can be moved by moving the members even if the PCB may not be moved by the board conveying device. In the above-indicated latter case, the stopper, the stopper displacing device, the positioning members, and the positioning-member displacing device are moved to a position where they stop and position a PCB before the PCB is fed in. As will be described on a preferred embodiment of the invention, the positioning members may be positioning pins which fit in positioning holes formed in a PCB and thereby position the PCB, or a sucking member which sucks, by vacuum, a PCB and thereby positions the PCB. The positioning-member moving device may be one which rotates the positioning members about an axis line to their operative and inoperative positions, or one which linearly moves the positioning members to their operative and inoperative positions. In the case where the present PCB supporting and positioning apparatus is employed by a PCB mounting system, a plurality of ECs can be mounted at a plurality of positions on a PCB which are distant from each other in a direction parallel to the board conveying route, without having to change a component mounting position of a component mounting device of the EC mounting system. In addition, in the case where the present apparatus is employed by an apparatus for applying a highly viscous fluid to a PCB, the fluid applying apparatus can apply a highly viscous fluid such that an identical fluid pattern is provided at each of a plurality of positions on the PCB which are distant from each other in the direction parallel to the board conveying route.

According to a twenty-fifth feature of the invention which includes the twenty-fourth feature (24), the supporting-member displacing device comprises at least one fluid-pressure-operated cylinder device.

According to a twenty-sixth feature of the invention which includes the twenty-fourth feature (24) or the twenty-fifth feature (25), the supporting-member moving device comprises a movable member which is movable in a direction parallel to the direction in which the supporting member is movable; a supporting-member-related fluid-pressure-operated cylinder device which is provided between the movable member and the supporting member and which moves the supporting member relative to the movable member; and a movable-member-related fluid-pressure-operated cylinder device which is provided between the movable member and an immovable member and which moves the movable member relative to the immovable member.

According to a twenty-seventh feature of the invention which includes the twenty-sixth feature (26), the supporting-member moving device further comprises a guide member which commonly guides the supporting member and the movable member.

According to a twenty-eighth feature of the invention which includes the twenty-seventh feature (27), the supporting member and the movable member at least partly overlap each other in a direction parallel to the guide member.

According to a twenty-ninth feature of the invention which includes the twenty-eighth feature (28), one of the respective overlapping portions of the supporting member and the movable member has an opening, and the supporting-member moving device further comprises a connecting projection which projects from the other of the respective overlapping portions and extends through the opening from one side of the one overlapping portion to the other side thereof, the movable-member-related fluid-pressure-operated cylinder device being connected to the connecting projection and one of the supporting member and the movable member which includes the one overlapping portion having the opening.

According to a thirtieth feature of the invention which includes any one of the twenty-fourth to twenty-ninth features (24) to (29), the stopper comprises a swingable stopper which is swingable to the operative and inoperative positions thereof about an axis line parallel to an X-Y plane parallel to a board-support plane on which the printed circuit board is supported by the board conveying device, and wherein the stopper displacing device comprises a stopper swinging device which swings the swingable stopper to the operative and inoperative positions thereof. The axis line about which the swingable stopper is swingable may be parallel to the board conveying route, or perpendicular to the board conveying route on the X-Y plane.

According to a thirty-first feature of the invention which includes any one of the twenty-fourth to thirtieth feature (24) to (30), the plurality of positioning members comprise a plurality of positioning pins which fit in a plurality of positioning holes of the printed circuit board stopped by the stopper, respectively, and thereby position the printed circuit board, and wherein the positioning-member displacing device comprises a positioning-pin displacing device which displaces the positioning pins to the operative position thereof in which the positioning pins fit in the positioning holes of the printed circuit board and to the inoperative position thereof where the pins do not fit in the holes of the board.

According to a thirty-second feature of the invention which includes the thirty-first feature (31), the plurality of positioning pins are attached to a plurality of pin supporting arms, respectively, which project from a rotatable shaft rotatable about an axis line parallel to an X-Y plane parallel to a board-support plane on which the printed circuit board is supported by the board conveying device, the pin supporting arms being swung when the rotatable shaft is rotated, the positioning pins being swung to the operative and inoperative positions thereof when the pin supporting arms being swung, and wherein the positioning-pin displacing device comprises a rotatable-shaft rotating device which rotates the rotatable shaft. The axis line about which the rotatable shaft is rotatable may be parallel to the board conveying route, or perpendicular to the board conveying route on the X-Y plane.

According to a thirty-third feature of the invention which includes the thirty-second feature (32), at least one of the plurality of pin supporting arms is attached to the rotatable shaft such that a position of the one arm relative to the rotatable shaft in an axial direction of the rotatable shaft is adjustable. In this case, since the position or positions of one or more pin supporting arms can be adjusted corresponding to different sorts of PCBs having positioning holes at different positions, the positioning pins can fit, in their operation position, the positioning holes of each of the different sorts of PCBs and thereby position said each PCB.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

There will be described an electronic-component ("EC") mounting system to which the present invention is applied.

Figure 1:
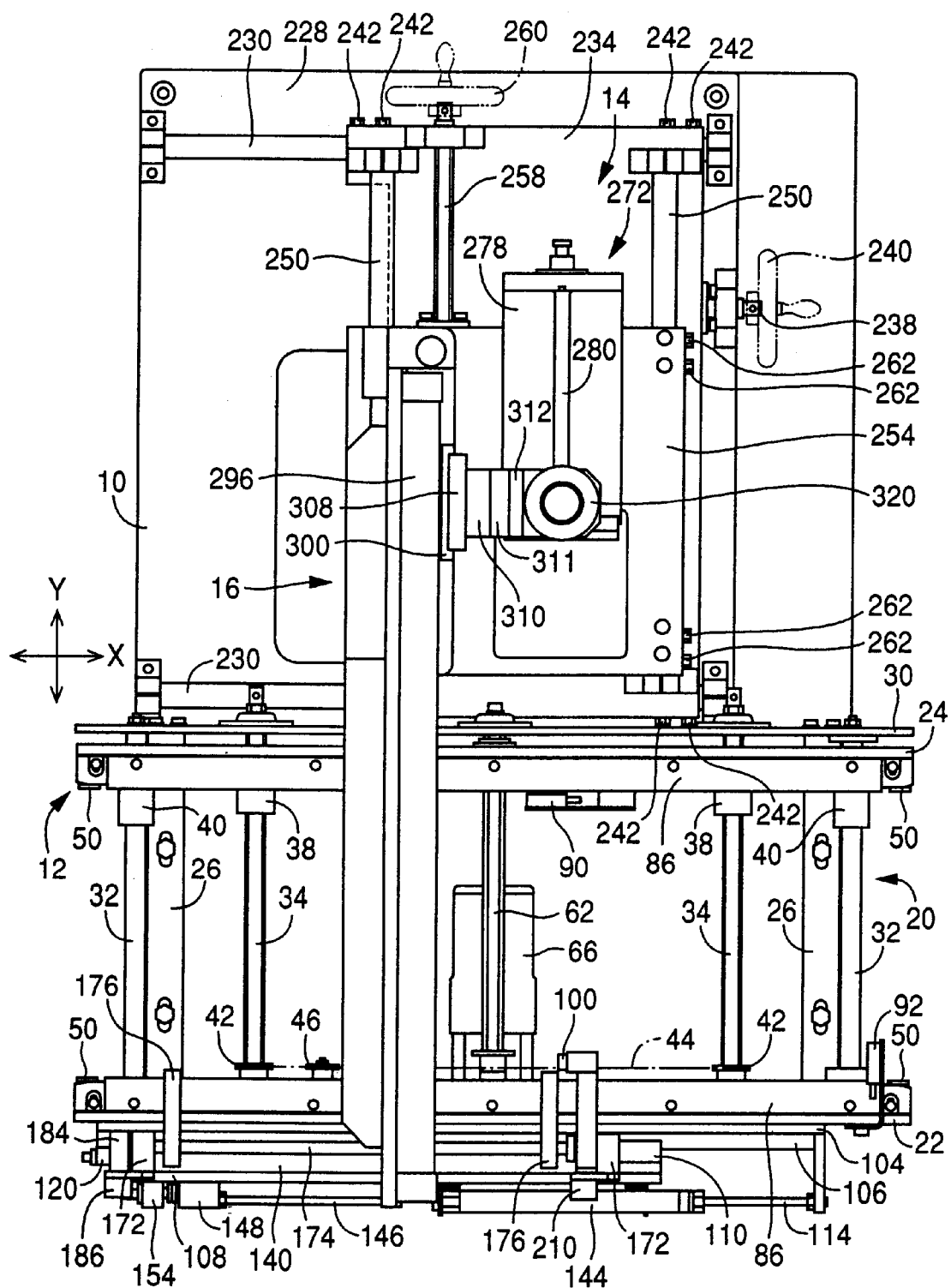
FIG. 1 is a plan view of an electronic-component ("EC") mounting system to which the present invention is applied.

In FIG. 1, reference numeral 10 designates a bed which supports a printed circuit board ("PCB") supporting and positioning apparatus 12, an EC supplying apparatus 14, and an EC mounting apparatus 16.

Figure 2:
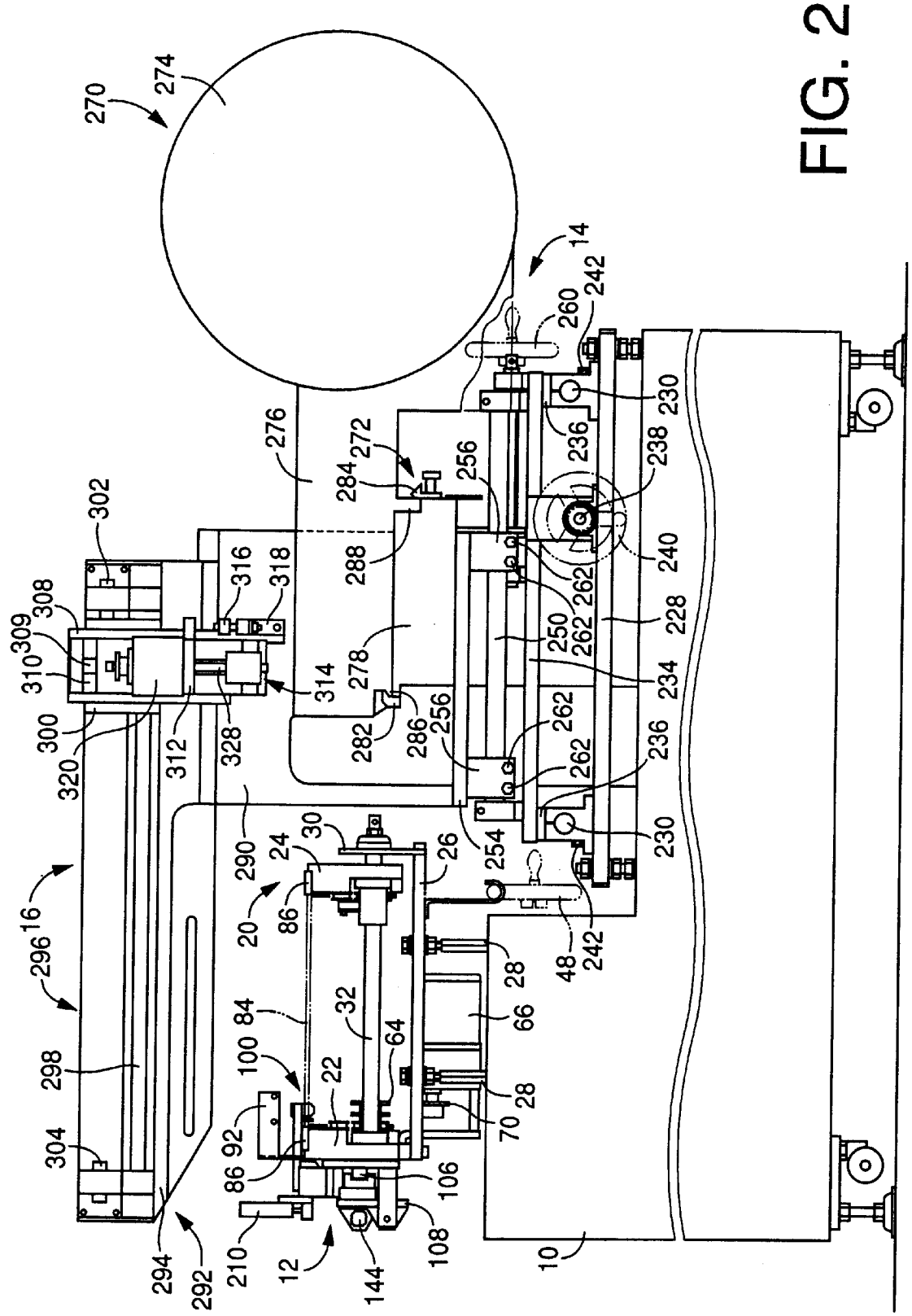
FIG. 2 is a side elevation view of the EC mounting system of FIG. 1.

As shown in FIGS. 1 and 2, the PCB supporting and positioning apparatus 12 includes a board conveying device 20. The board conveying device 20 includes a pair of rail members in the form of a fixed rail 22 and a movable rail 24. On the bed 10, there are provided a pair of elongate supporting plates 26 each of which is supported by two supporting members 28 such that the each supporting plate 26 is spaced from the upper surface of the bed 10. The fixed rail 22 is fixed to respective one ends of the elongate supporting plates 26. A mounting plate 30 is fixed to the respective other ends of the elongate supporting plates 26. The mounting plate 30 has substantially the same length as that of the fixed rail 22, extends parallel to the fixed rail 22, and has a pair of vertical major side surfaces. The fixed rail 22 and the fixed mounting plate 30 cooperate with each other to support opposite ends of each of two guide rods 32 as guide members and additionally support opposite ends of each of two screw shafts 34 such that the each screw shaft 34 is rotatable about an axis line thereof.

The movable rail 24 is threadedly engaged with the screw shafts 34 as feeding screws via rail nuts 38 which are fixed to the movable rail 24, and is slideably fit on the guide rods 32 via guide blocks 40 as guided portions which are fixed to the movable rail 24, so that that the movable rail 24 is movable in an axial direction of the screw shafts 34 and the guide rods 32 when the screw shafts 34 are rotated. A sprocket 42 is fixed to the one end of each screw shaft 34 on the side of the fixed rail 22. A chain 44 is wound on the two sprockets 42, and is stretched out by a tensioning sprocket 46. When an operator engages a handle 48 with one of the two screw shafts 34 and rotates the handle 48, the rotation of the one screw shaft 34 is transmitted to the other screw shaft 34, so that the movable rail 24 is moved toward, and away from, the fixed rail 22. Thus, a board conveying width defined by the distance between the two rails 22, 24 is adjustable. Hereinafter, a direction parallel to the longitudinal direction of the two rails 22, 24 will be referred to as an X direction.

A grooved pulley 50 as a rotatable member is rotatably attached to each of opposite ends of each of respective inner surfaces of the fixed and movable rails 22, 24 that are opposed to each other. An elongate belt guide (not shown) as a guide member is fixed to an intermediate portion of each of the two rails 22, 24 that is between the pair of grooved pulleys 50 of the each rail 22, 24. A belt 54 (FIG. 3) as a wound-on member is wound on each pair of grooved pulleys 50 and the belt guide associated with the each pair of pulleys 50.

Figure 3:
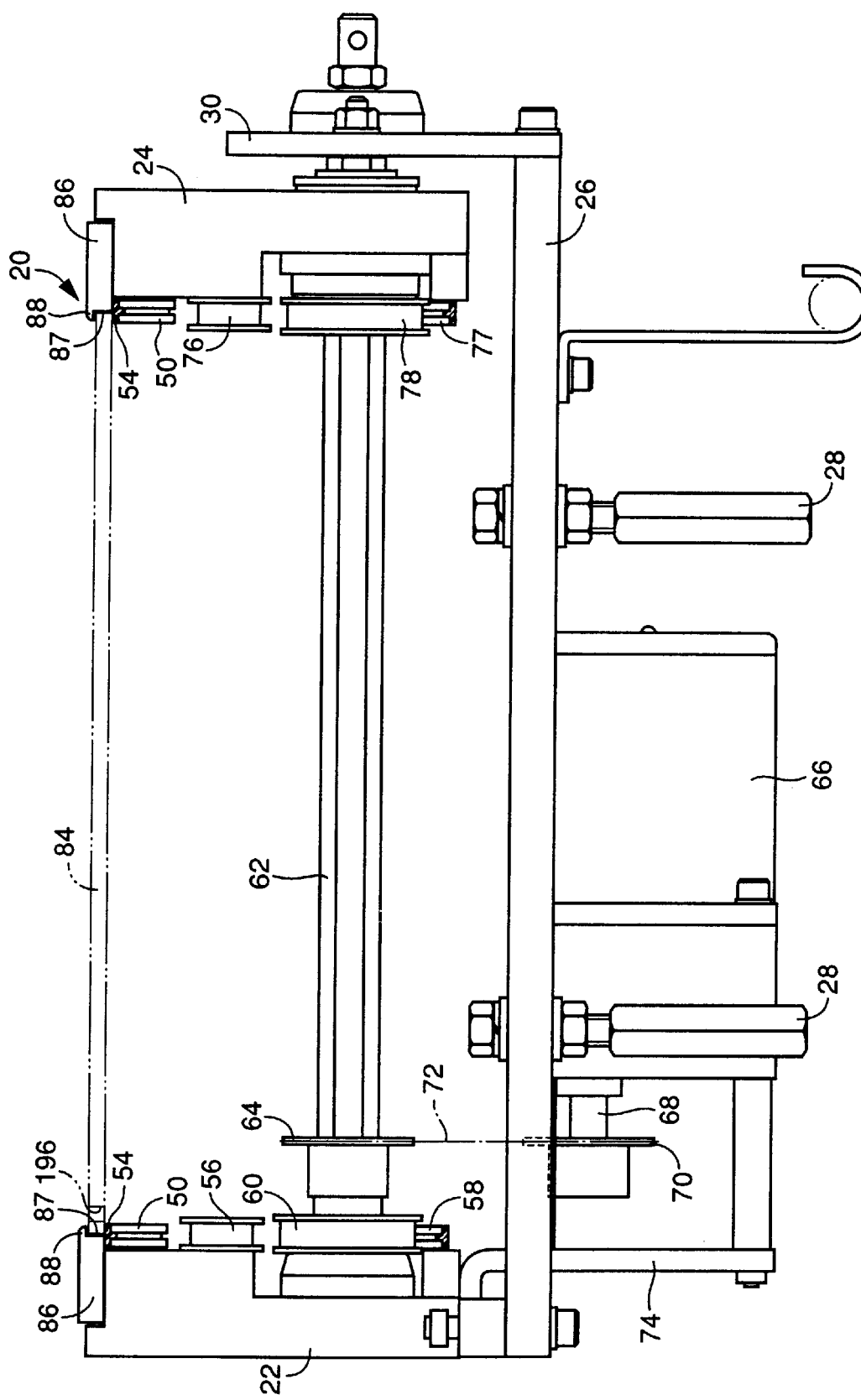
FIG. 3 is a side elevation view of a board conveying device of a printed circuit board ("PCB") supporting and positioning apparatus as part of the EC mounting system of FIG. 1.
Figure 4:
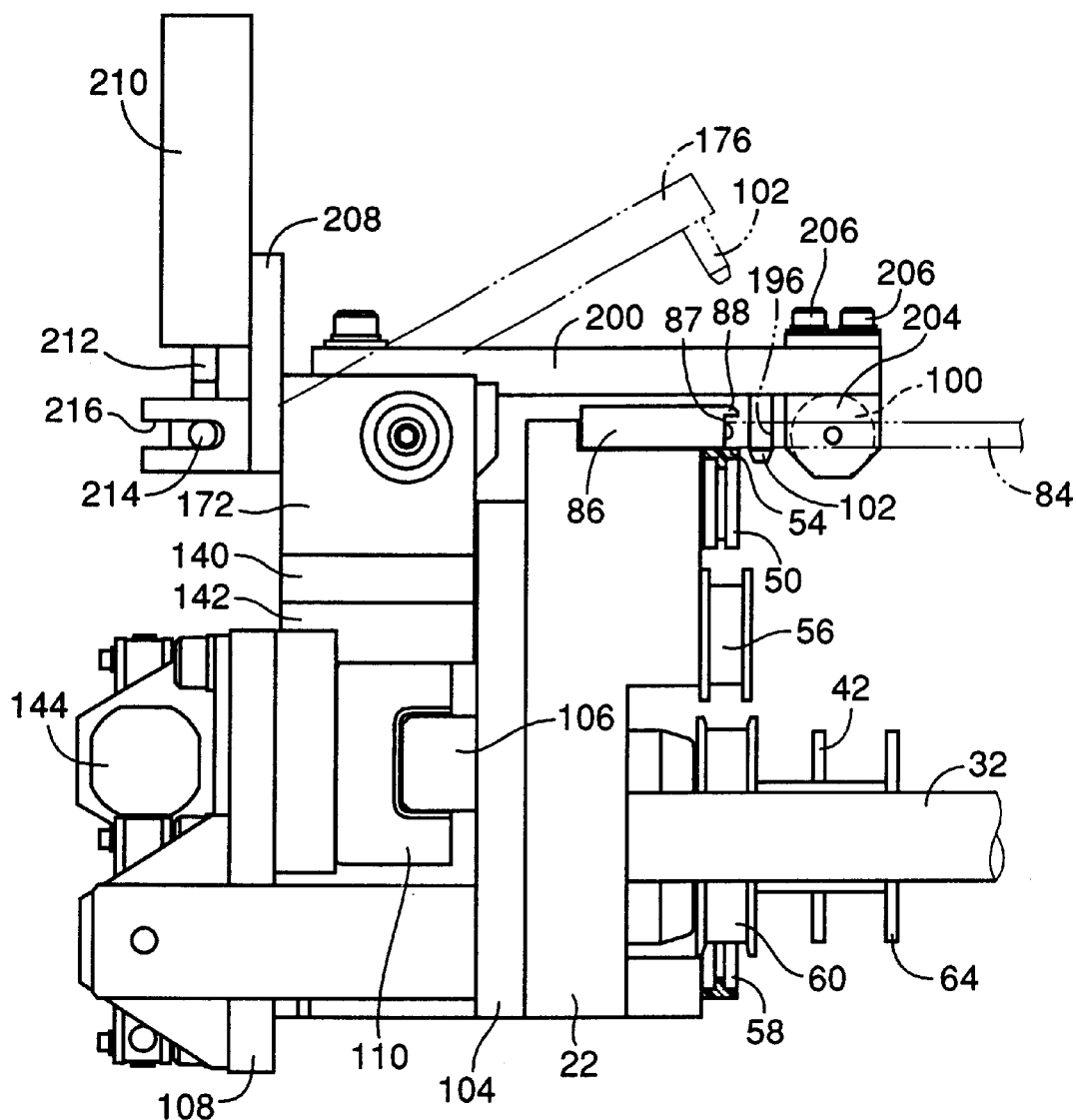
FIG. 4 is a side elevation view of the board conveying device of FIG. 3, a rotatable stopper, and rotatable positioning pins.

The belt 54 on the side of the fixed rail 22 is further wound on two tensioning pulleys 56 as tensioning members (only one 56 is shown in FIG. 3), two grooved pulleys 58 as rotatable members (only one 58 is shown in FIGS. 3 and 4), and a driven pulley 60 as a rotatable driven member (FIG. 3). The driven pulley 60 is fixed to a spline shaft 62 as a rotatable transmission shaft whose opposite ends are rotatably supported by the fixed rail 22 and the mounting plate 30. A sprocket 64 is fixed to the spline shaft 62, and is connected to a sprocket 70 as a rotatable member which is fixed to an output shaft 68 of a board conveying servomotor 66 as a drive source, via a chain 72 as a wound-on member. As shown in FIG. 3, the board conveying servomotor 66 is attached to the fixed rail 22 via a bracket 74.

The belt 54 on the side of the movable rail 24 is further wound on two tensioning pulleys 76 as tensioning members (only one 76 is shown in FIG. 3), two grooved pulleys 77 (only one 77 is shown in FIG. 3), and a driven pulley 78 as a rotatable driven member. The driven pulley 78 is attached to the movable rail 24 such that the driven pulley 78 is rotatable about an axis line thereof and is not movable in an axial direction thereof, and is splinedly fit on the spline shaft 62. Therefore, when the board conveying servomotor 66 is activated, the sprockets 70, 64 are rotated, the spline 62 is rotated, and the driven pulleys 60, 78 are rotated, so that the pair of belts 54 are moved or circulated. A PCB (printed circuit board) 84 is placed on the pair of belts 54, and is conveyed because of the friction of the PCB 84 and the belts 54 when the belts 54 are moved. The respective belts 54 of the fixed and movable rails 22, 24 that horizontally extend cooperate with each other to support and convey the PCB 84 such that the PCB 84 maintains a horizontal posture. A route through which the PCB 84 is conveyed by the belts 54 will be referred to as the board conveying route, and a direction in which the PCB 84 is conveyed through the board conveying route will be referred to as the board conveying direction. The board conveying route and the board conveying direction are parallel to the X direction, and a reference plane on which the PCB 84 is supported by the belts 54 is a horizontal plane.

As shown in FIGS. 1 and 3, a guide member 86 is fixed to an upper surface of each of the fixed and movable rails 22, 24. The pair of guide members 86 have substantially the same length as that of the two rails 22, 24, and have respective vertical guide surfaces 87 which cooperate with each other to guide the movement of the PCB 84 by contacting opposite sides of the same 84. Each of the two guide members 86 includes a hold-down portion 88 which prevents the PCB 84 from jumping up from the corresponding belt 54.

The PCB 84 is conveyed in a direction from the left to the right in FIG. 1. As shown in FIG. 1, a board feed-in sensor 90 as a board feed-in detecting device is provided at a generally middle position on the movable rail 24 in the board conveying direction. The feed-in sensor 90 is provided by a reflection-type photoelectric sensor including a light emitter and a light detector. In addition, a board feed-out sensor 92 as a board feed-out detecting device is provided at a downstream end of the fixed rail 22 in the board conveying direction. The feed-out sensor 92 is also provided by a reflection-type photoelectric sensor including a light emitter and a light detector.

As shown in FIG. 4, the fixed rail 22 is associated with a rotatable stopper 100 which engages the leading end of the PCB 84 and thereby stops the movement of the same 84, and a rotatable positioning pin 102 which positions the PCB 84 relative to the bed 10. A mounting plate 104 as a mounting member is fixed to an outer surface of the fixed rail 22 that is opposite to the inner surface of the same 22 opposed to the inner surface of the movable rail 24, and a guide rail 106 as a movable-member guide is fixed to the mounting plate 104 such that the guide rail 106 extends parallel to the board conveying direction.

Figure 5:
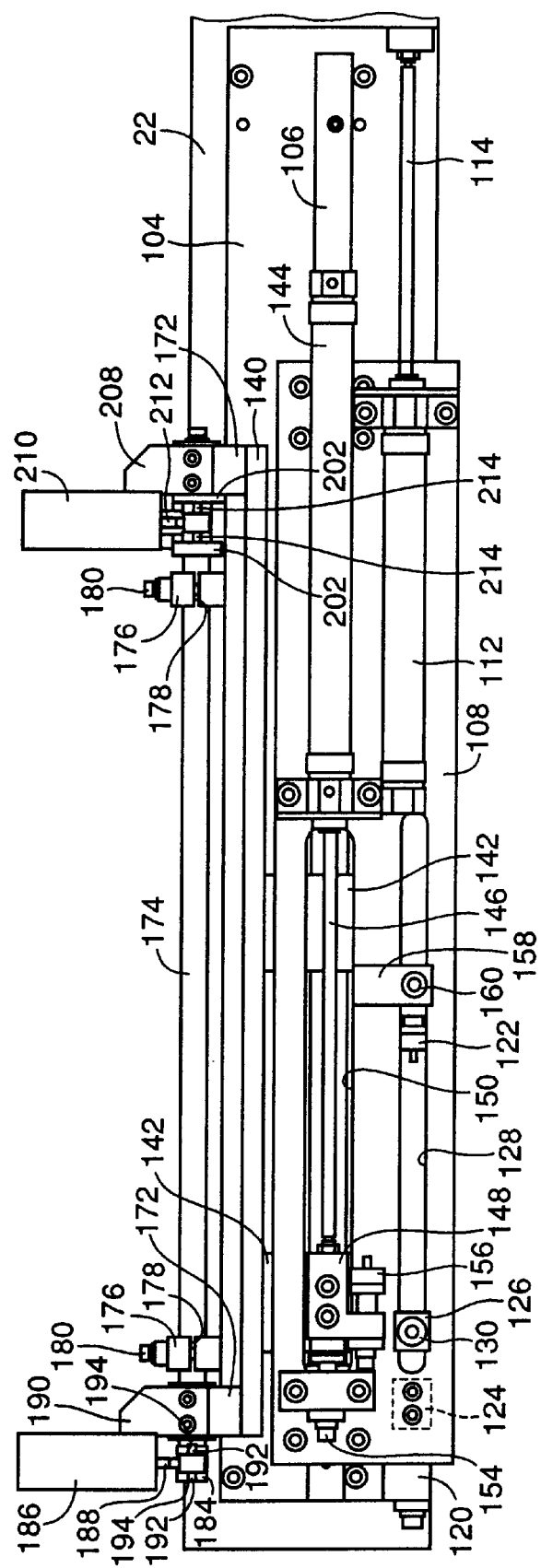
FIG. 5 is a front elevation view of a supporting-member displacing device which displaces a supporting member which supports the rotatable stopper and the rotatable positioning pins.
Figure 6:
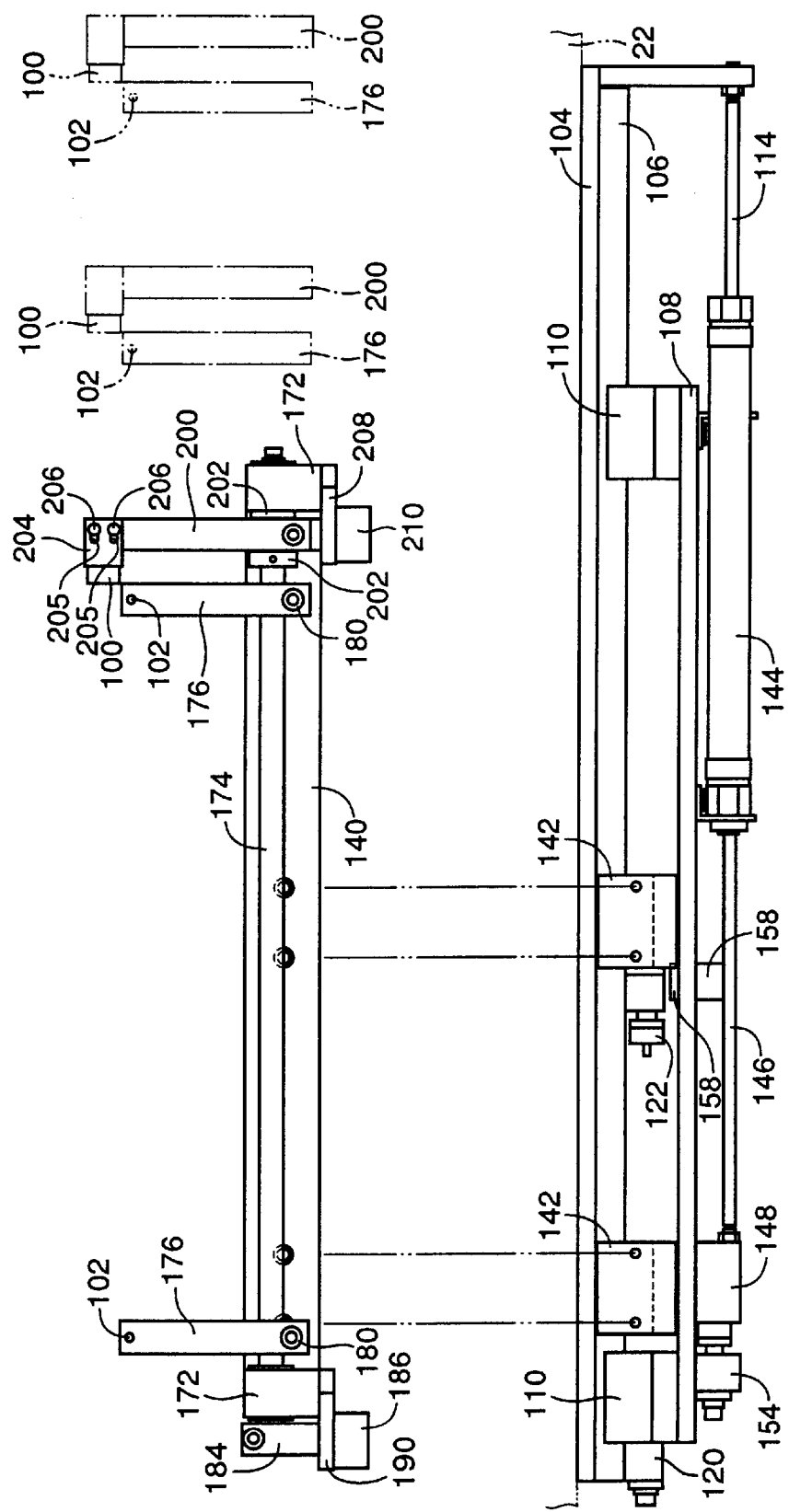
FIG. 6 is a plan view of the rotatable stopper, the rotatable positioning pins, and the supporting-member displacing device.

As shown in FIG. 6, two guide blocks 110 which are fixed to a movable member 108 and serve as guided members for the same 108 are slideably fit on the guide rail 106. The movable member 108 is provided by an elongate plate, and the two guide blocks 110 are fixed to opposite ends of the elongate movable member 108, respectively. As shown in FIG. 5, a movable-member air cylinder 112 as a fluid-pressure cylinder is mounted on one of opposite surfaces of the movable member 108 that is distant from the mounting plate 104, such that the air cylinder 112 extends parallel to the direction of movement of the movable member 108, i.e., the board conveying direction. The air cylinder 112 includes a piston rod 114 whose projected end is fixed to the mounting plate 104. Thus, when the piston rod 114 is advanced from, and retracted into, the air cylinder 112, the movable member 108 is moved in the board conveying direction by being guided by the guide rail 106.

As shown in FIG. 5, opposite ends or limits of movement of the movable member 108 are defined by stoppers 120, 122 which are fixed to the mounting plate 104 and each of which has a shock absorber, and two pairs of butting members 124, 126 which are fixed to the movable member 108 and which can butt on the two stoppers 120, 122, respectively. The movable member 108 has an opening 128 which extends in the direction of movement thereof, and the stopper 122 is provided at a position on the mounting plate 104 that corresponds to the opening 128 of the movable member 108. Each of the two butting members 126 (only one 126 is shown in FIG. 5) includes a head portion larger than the opening 128, and a fitting portion which fits in the opening 128, and the two butting members 126 fit in the opening 128 from both sides of the opening 128. A bolt 130 is threadedly engaged with the two butting members 126, so that the respective head portions of the two butting members 126 cooperate with each other to sandwich the movable member 108. Thus, the pair of abutting members 126 are fixed to the movable member 108. When the engagement of the bolt 130 is loosened and the pair of butting members 126 are moved along the opening 128, the downstream end or limit of movement of the movable member 108 in the board conveying direction can be adjusted. Thus, the stoppers 120, 122 and the butting members 124, 126 cooperate with one another to provide a movable-member stopping and movement-limit adjusting device.

The stopper 120 accommodates a sensor (not shown) which detects or identifies that the butting members 124 butt on the stopper 120, and the stopper 122 accommodates a sensor (not shown) which detects or identifies that the butting members 126 butt on the stopper 122. Thus, those sensors detect or identify that the movable member 108 has been moved to its predetermined upstream end or limit and its pre-adjusted downstream end or limit, respectively.

A supporting member 140 slideably fits on the guide rail 106 which guides the movement of the movable member 108. The supporting member 140 is provided by an elongate plate, and two guide blocks 142 are fixed to an upstream-end and a middle portion of the supporting member 142, respectively, and slideably fit on the guide rail 106 so that the guide blocks 142 serve as guided members for the same 142. The distance between the two guide blocks 142 is shorter than that between the two guide blocks 110 fixed to the movable member 108, and the two guide blocks 142 fit on a portion of the guide rail 106 that is between the two guide blocks 110 fixed to the guide rail 106.

A supporting-member air cylinder 144 as a fluid-pressure is mounted on the movable member 108. The air cylinder 144 extends parallel to the direction of movement of the movable member 108, and has a piston rod 146 including an end portion to which a connecting member 148 is attached.

An opening 150 which extends parallel to the direction of movement of the supporting member 140 is formed in a portion of the movable member 108 which corresponds to the two guide blocks 142 of the supporting member 140. The connecting member 148 extends through the opening 150 toward the mounting plate 104, and is fixed to the guide block 142 fixed to the upstream-end portion of the supporting member 140. Therefore, when the piston rod 146 of the air cylinder 144 is advanced from, and retracted into, the air cylinder 144, the supporting member 140 is moved relative to the mounting plate 104 and the movable member 108 in the direction parallel to the board conveying direction, while being guided by the guide rail 106. Thus, the movable member 108, the movable-member air cylinder 112, and the supporting-member air cylinder 144 cooperate with one another to provide a supporting-member displacing device.

Opposite ends or limits of movement of the supporting member 140 are defined by a stopper 154 which is attached to the movable member 108 and which has a shock absorber and the connecting member 148 which can butt on the stopper 154, and a stopper 156 which is attached to the connecting member 148 and which has a shock absorber and a pair of butting members 158 which can butt on the stopper 156. Each of the two butting members 158 includes a head portion larger than the opening 128, and a fitting portion which fits in the opening 128, and the two butting members 126 fit in the opening 128 from both sides of the opening 128. A bolt 160 is threadedly engaged with the two butting members 158, so that the respective head portions of the two butting members 158 cooperate with each other to sandwich the movable member 108. Thus, the pair of butting members 158 are fixed to the movable member 108. One of the two butting members 158 that fits in the opening 128 from one side of the movable member 108 that is distant from the mounting plate 104, includes a projecting portion which extends upward and can butt on the stopper 156. When the engagement of the bolt 160 is loosened and the pair of butting members 158 are moved along the opening 128, the downstream end or limit of movement of the supporting member 140 in the board conveying direction can be adjusted. Thus, the stoppers 154, 156, the connecting member 148, and the butting members 158 cooperate with one another to provide a supporting-member stopping and movement-limit adjusting device.

The stopper 154 accommodates a sensor (not shown) which detects or identifies that the connecting member 148 butts on the stopper 154, and the stopper 156 accommodates a sensor (not shown) which detects or identifies that the butting members 158 butt on the stopper 156. Thus, those sensors detect or identify that the supporting member 140 has been moved to its predetermined upstream end or limit and its pre-adjusted downstream end or limit, respectively.

The supporting member 140 has, at opposite ends thereof, two supporting portions 172 which cooperate with each other to support a rotatable shaft 174 which is rotatable about an axis line parallel to the board conveying route. Respective one ends of two pin supporting arms 176 fit on the rotatable shaft 174, and the respective other ends of the two arms 176 support the above-indicated rotatable positioning pins 102 (FIG. 4 or FIG. 6) such that the two pins 102 are oriented downward.

As shown in FIG. 5, each of the pin supporting arms 176 has a fitting hole in which the rotatable shaft 174 fits, and a slit 178 which extends parallel to a center line of the fitting hole and communicates with the fitting hole. Thus, the slit 178 divides one end portion of each arm 178 into two portions with which a bolt 180 is threadedly engaged, so that the slit 178 is tightened and the diameter of the fitting hole is reduced. Thus, each arm 176 is fixed to the rotatable shaft 174.

As shown in FIGS. 5 and 6, an engaging member 184 is fixed to the upstream-side supporting portion 172 of the supporting member 140, and a piston rod 188 of a rotatable-positioning-pin air cylinder 186 is engaged with the engaging member 184. The air cylinder 186 is attached to the supporting portion 172 via a bracket 190 such that the air cylinder 186 is oriented downward. A pair of engaging projections 192 project from a printed end of the piston rod 188, and fit in a pair of recesses 194 formed in the engaging member 184.

Therefore, when the piston rod 188 is advanced from, and retracted into, the air cylinder 186, the engaging member 184 and the rotatable shaft 174 are rotated because of the engagement of the engaging projections 192 and the recesses 194, so that the pair of rotatable positioning pins 102 are simultaneously rotated about the axis line parallel to the board conveying route, to an operative position in which the two pins 102 fit in two positioning holes 196 (FIG. 4) formed in the PCB 84 so as to position the PCB 84 relative to the bed 10, and to an inoperative position in which the pins 102 are away from the holes 196. Thus, the engaging member 184, the air cylinder 186, and the engaging projections 192 cooperate with one another to provide a rotatable-shaft rotating device as a sort of positioning-pin displacing device. When the engagement of each bolt 180 is loosened and the corresponding pin supporting arm 176 is moved on the rotatable shaft 174, the position of the corresponding positioning pin 102 in the direction parallel to the board conveying direction can be adjusted. In the case where PCBs 84 of a first sort have positioning holes 196 at respective positions different from those of positioning holes 196 of PCBs 84 of a second sort, when the PCBs 84 of the first sort are changed with the PCBs 84 of the second sort, the position or respective positions of one or both of the positioning pins 102 is or are adjusted.

The rotatable-positioning-pin air cylinder 186 is provided with two sensors (not shown) which detect or identify that the piston rod 194 has been moved to its predetermined advanced and retracted positions (i.e., two stroke ends or limits), respectively. Thus, those sensors detect or identify that the two rotatable positioning pins 102 have been rotated to their operative and inoperative positions, respectively.

As shown in FIG. 6, one end portion of a stopper supporting arm 200 fits on a portion of the rotatable shaft 174 between the downstream-side supporting portion 172 of the supporting member 140 and the downstream-side rotatable positioning pin 102. As shown in FIG. 4, the above-indicated rotatable stopper 100 is attached to the projecting portion of the arm 200 via a bracket 204. The bracket 204 has a pair of elongate holes 205 which extend in the X direction, and two screws 206 are threadedly engaged with the arm 200 through the two holes 205, respectively, so that the bracket 204 is fixed to the arm 200. Thus, the position of the bracket 204 or the position of the rotatable stopper 100 fixed to the bracket 204, relative to the arm 200, can be finely adjusted. The arm 200 has a fitting hole in which the rotatable shaft 174 fits. The filling hole has a diameter slightly larger than that of the shaft 174. Thus, the arm 200 is rotatable relative to the shaft 174. The arm 200 is prevented from being moved in the axial direction of the shaft 174 by a pair of flanges 202 which are provided on the shaft 174 so as to sandwich the arm 200.

A rotatable-stopper air cylinder 210 is attached to the downstream-side supporting portion 172 of the supporting member 140 via a bracket 208, such that the air cylinder 210 is oriented downward. A pair of engaging projections 214 which are provided at a projected end of a piston rod 212 of the air cylinder 210, fit in a pair of recesses 216 (FIG. 4) provided in the stopper supporting arm 200. Therefore, when the piston rod 212 is advanced from, and retracted into, the air cylinder 210, the arm 200 is rotated about the axis line parallel to the board conveying route, so that the rotatable stopper 100 is rotated to an operative position in which the stopper 100 engages the PCB 84 and thereby stops the movement of the same 84, and to an inoperative position in which the stopper 100 does not contact the PCB 84. Thus, the rotatable-stopper air cylinder 210, the engaging projections 214, the stopper supporting arm 200, etc. cooperate with one another to provide a stopper rotating device as a sort of stopper displacing device. Strictly, the above-indicated board feed-in sensor 90 is provided slightly upstream of the rotatable stopper 100 in the board conveying direction.

The rotatable-stopper air cylinder 210 is provided with two sensors (not shown) which detect or identify that the piston rod 213 has been moved to its predetermined advanced and retracted positions (i.e., two stroke ends or limits), respectively. Thus, those sensors detect or identify that the rotatable stopper 100 has been rotated to its operative and inoperative positions, respectively.

As shown in FIG. 1, the EC supplying apparatus 14 and the EC mounting system 16 are provided, on the bed 10, adjacent to the PCB supporting and positioning apparatus 12 in a Y direction perpendicular to the X direction on a horizontal plane, i.e., an X-Y plane defined by the X and Y directions. Thus, the X-Y plane is parallel to the reference plane on which the PCB 84 is supported by the supporting apparatus 12. On the bed 10, a supporting table 228 (FIG. 2) is fixed such that the supporting table 228 extends horizontally. On the supporting table 228 a pair of guide rails 230 as guide members are provided such that the guide rails 230 extend parallel to the X direction. An X-direction slide member 234 slideably fits on the pair of guide rails 230 via four guided members 236 (only two 236 are shown in FIG. 2), i.e., two for one of the guide rails 230, and two for the other rail 230.

Like the pin supporting arms 176 which fit on the rotatable shaft 174, each of the guided portions 236 has a fitting hole which fits on the corresponding guide rail 230, and a slit which communicates with the fitting hole and thereby divides a portion of the each guided portion 236 into two half portions. With the fitting hole of each guided portion 236 fitting on the corresponding guide rail 230, two screw members 242 are threadedly engaged with the divided portions of the each guided member 236, so that the slit is tightened and the X-direction slide member 234 is clamped to the corresponding guide rail 230 or the bed 10. Thus, the four guided members 236 and the eight screw members 242 cooperate with each other to provide an X-direction clamping device.

An X-direction nut (not shown) is fixed to the X-direction slide member 234, and is threadedly engaged with an X-direction feeding screw 238 which is provided on the bed 10 such that the feeding screw 238 (FIG. 2) extends parallel to the X direction, is rotatable about an axis line thereof, and is immovable in an axial direction thereof. When the respective engagements of the eight screw members 242 are loosened so as to release the X-direction slide member 234 from the supporting table 228, and an operator engages a handle 240 with the X-direction feeding screw 238 so as to rotate the handle 240, the X-direction slide member 234 is moved to a desired position in the X-direction. After the slide member 234 has been moved to the desired position, the screw members 242 are fastened so as to clamp the slide member 234 to the supporting table 228 or the bed 10.

On the X-direction slide member 234, a pair of guide rails 250 as guide members are provided such that the guide rails 250 extend parallel to the Y direction. A Y-direction slide member 254 slideably fits on the pair of guide rails 250 via four guided members 256 (only two 256 are shown in FIG. 2), i.e., two for one of the guide rails 250, and two for the other rail 250. Like the guided members 236 provided on the lower surface of the X-direction slide member 234, each of the guided portions 256 has a fitting hole which fits on the corresponding guide rail 250, and a slit which communicates with the fitting hole and thereby divides a portion of the each guided portion 256 into two half portions. With the fitting hole of each guided portion 256 fitting on the corresponding guide rail 250, two screw members 262 are threadedly engaged with the divided portions of the each guided member 256, so that the slit is tightened and the Y-direction slide member 254 is clamped to the corresponding guide rail 250 or the X-direction slide member 234. Thus, the four guided members 256 and the eight screw members 262 cooperate with each other to provide a Y-direction clamping device.

A Y-direction nut (not shown) is fixed to the Y-direction slide member 254, and is threadedly engaged with a Y-direction feeding screw 258 which is provided on the X-direction slide member 234 such that the feeding screw 258 extends parallel to the Y direction, is rotatable about an axis line thereof, and is immovable in an axial direction thereof. When the respective engagements of the eight screw members 262 are loosened so as to release the Y-direction slide member 254 from the X-direction slide member 234, and an operator engages a handle 260 with the Y-direction feeding screw 258 so as to rotate the handle 260, the Y-direction slide member 254 is moved to a desired position in the Y-direction. After the slide member 254 has been moved to the desired position, the screw members 262 are fastened so as to clamp the slide member 254 to the X-direction slide member 234.

As shown in FIG. 2, the bed 10 has a step, and the X-direction and Y-direction slide members 234, 254 are provided on a lower portion of the bed 10 whereas the PCB supporting and positioning apparatus 12 is provided on an upper portion of the bed 10. Thus, the vertical distance between the PCB supporting and positioning apparatus 12 and the EC supplying and mounting apparatuses 14, 16 is made small.

As shown in FIG. 1, a cartridge supporting table 278 is fixed to the Y-direction slide member 254. As shown in FIG.

2, an EC supplying cartridge 270 (hereinafter, referred to as the "cartridge" 270) is attached to the cartridge supporting table 278 by an attaching device 272. The cartridge 270 supplies an EC tape including an EC carrying tape having a number of EC accommodating pockets and a cover tape covering respective upper openings of the pockets of the carrying tape in which ECs are accommodated, respectively. The EC tape is wound around a reel 274 which is rotatably attached to a rear end portion of a main body 276 of the cartridge 270, and the EC tape is intermittently fed by a feeding device (not shown) at a feeding pitch which is equal to a regular interval at which the EC accommodating pockets are provided on the EC carrying tape. The leading one of the ECs from which the cover tape has been removed is fed to an EC-supply position. A portion of the cartridge 270 which includes the EC-supply position is defined as an EC-supply portion thereof. The cartridge main body 276 supports a take-up reel (not shown) which takes up the cover tape removed from the EC carrying tape, and a reel drive device which drives or rotates the take-up reel.

As shown in FIG. 1, the cartridge supporting table 278 has a positioning groove 280 extending parallel to the Y direction. As shown in FIG. 2, a stopper plate 282 is fixed to one end of the positioning groove 280 that is near to the PCB supporting and positioning apparatus 12. An engaging lever 284 is attached to one end face of the cartridge supporting table 278 that is remote from the apparatus 12, such that the engaging lever 284 is rotatable about an axis line parallel to the X direction and is biased by a spring (not shown) in a direction in which an upper portion of the lever 284 is rotated toward the supporting table 278.

The main body 276 of the cartridge 270 has a positioning projection (not shown) projecting from the lower surface thereof. When the positioning projection of the cartridge 270 fits in the positioning groove 280, an engaging projection 286 provided in a front end portion of the main body 276 is engaged with the stopper plate 282, and the engaging lever 284 is engaged with another engaging projection 288 projecting downward from a rear portion of the main body 276, the cartridge 270 is positioned (i.e., fixed in position) in the X direction (i.e., in the widthwise direction thereof) and in the Y direction (i.e., in a direction parallel to the direction of feeding of the EC tape), and is prevented from moving up from the cartridge supporting table 278. Thus, the cartridge 270 is attached to the table 278.

As shown in FIG. 2, the Y-direction slide member 254 supports an upright column 290. An arm 292 projects from an upper end portion of the column 290, in a direction parallel to the Y direction, and hangs over the fixed rail 22 of the PCB conveying device 20. The arm 292 has a vertical side surface 294 which supports a Y-direction rodless cylinder 296 as a fluid-pressure cylinder such that the cylinder 296 extends parallel to to the Y direction.

The rodless cylinder 296 is an air-pressure-operated (or pneumatically operated) cylinder, and is provided with a guide rail 298 as a head guide which extends in the Y direction. The cylinder 296 has a movable member (not shown) which is provided as an integral portion of a piston thereof and which projects out of a housing thereof in such a manner that the airtightness between the piston and the housing is maintained. When the movable member is moved in the Y direction, a movable table 300 which is fixed to the movable member is moved in the Y direction while being guided by the guide rail 298. The respective movements of the movable table 300 in opposite directions parallel to the Y direction are stopped or limited by butting of the table 300 on two stopper bolts 302, 304 which are provided at opposite ends of the housing of the cylinder 296, respectively, and each of which has a shock absorber. The respective positions of two opposite ends or limits of movement of the table 300 can be adjusted by changing the respective amounts of engagement of the stopper bolts 302, 304.

A Z-direction air slide table ("AIR SLIDE TABLE" is a commercial name) 310 is attached to the movable table 300 via a mounting member 308, such that the slide table 310 extends vertically, i.e., in a Z-direction perpendicular to the X-Y plane as a horizontal plane. The slide table 310 is provided with a guide rail 309 (FIG. 2), a table member 311 which is movable by being guided by the guide rail 309, and a pair of rodless cylinders (not shown) which moves the table member 311. The two rodless cylinders have the same construction as that of the Y-direction rodless cylinder 296, and the table member 311 is fixed to a movable member which is integral with respective pistons of the two rodless cylinders and which projects out of respective housings of the two cylinders in such a manner that the airtightness between each piston and the corresponding housing is maintained. When the movable member is moved, the table member 311 is moved in the Z direction by being guided by the guide rail 309.

A supporting member 312 is fixed to the table member 311, and a component mounting head 314 is supported by the supporting member 312. The mounting head 314 has a chuck including two pairs of grasping hands. One pair of hands are opened and closed in a direction perpendicular to the direction in which the other pair of hands are opened and closed. The chuck grasps and releases an EC when the two pairs of hands are closed and opened, respectively.

When the movable table 300 is moved by the Y-direction rodless cylinder 296, the component mounting head 314 is moved in the Y direction to a component receiving position corresponding to the component-supply portion of the cartridge 270 of the EC supplying apparatus 14, and to a component mounting position corresponding to a predetermined position on the PCB 84 where an EC is to be mounted. The component receiving position is aligned, in the Y direction, with the component-supply portion by adjusting one of the two opposite ends or limits of movement of the movable table 300. Meanwhile, the component receiving position is aligned, in the X direction, with the component-supply portion by improving the accuracy of assembling of the component mounting head 314 and the accuracy of attachment of the cartridge 270 to the cartridge supporting table 278.

A stopper 316 which is provided with a shock absorber is attached to the mounting member 308 via a bracket 318. The stopper 316 butts on the supporting member 312 and stops the downward movement of the same 312. The position of the stopper 316 relative to the bracket 318 in the Z direction is adjustable. Therefore, the lower end or limit of movement of the supporting member 312 or the component mounting head 314 is adjustable by adjusting the position of the stopper 316 relative to the bracket 318 in the Z direction.

Figure 7:
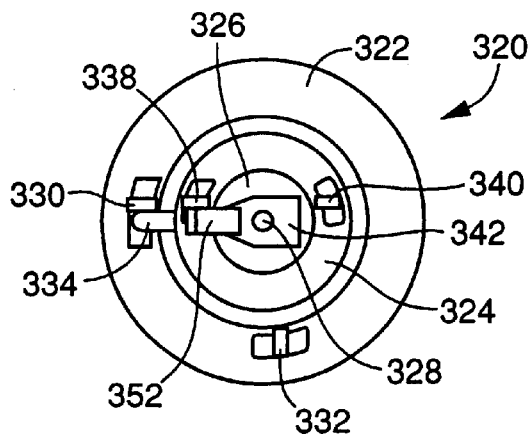
FIG. 7 is an illustrative view of a head rotating device which rotates a component mounting head of an EC mounting apparatus as part of the EC mounting system of FIG. 1.

The component mounting head 314 is rotatable about an axis line thereof parallel to the Z direction by a head rotating device 320. As schematically illustrated in FIG. 7, the head rotating device 320 includes a cylindrical main body 322, a cylindrical outer rotor 324 which fits in the main body 322 such that the outer rotor 324 is concentric with the main body 322 and is rotatable relative to the same 322, and an inner rotor 326 which fits in the outer rotor 324 such that the inner rotor 326 is concentric with the outer rotor 324 and is rotatable relative to the same 324. The rotating device 320 additionally includes an output shaft 328 (FIG. 2) which is concentrically fixed to the inner rotor 326. The outer rotor 324 is rotated in both forward and reverse directions by a rotary air actuator (not shown) provided on the main body 322, and the inner rotor 326 is rotated in both forward and reverse directions by a rotary air actuator (not shown) provided on the outer rotor 324.

An outer-rotor origin defining stopper 330 which defines an origin (i.e., reference position) of the outer rotor 324 is fixed to the main body 322, and an outer-rotor rotation-angle defining stopper 332 is fixed to the main body 322 at an angular position spaced from the stopper 330 by 90 degrees. One of two ends or limits of rotation of the outer rotor 324 is defined by the stopper 330 and an engaging member 334 which is provided on the outer rotor 324 and which butts on the stopper 330, and the other end is defined by the stopper 332 and the engaging member 334 which butts on the stopper 332.

An inner-rotor origin defining stopper 338 which defines an origin (i.e., reference position) of the inner rotor 326 is fixed to the outer rotor 324, and an inner-rotor rotation-angle defining stopper 340 is fixed to the outer rotor 324 at an angular position angularly spaced from the stopper 338 by 180 degrees. One of two ends or limits of rotation of the inner rotor 326 is defined by the stopper 338 and an engaging member 342 which is fixed to the output shaft 328 and which butts on the stopper 338, and the other end is defined by the stopper 340 and the engaging member 342 which butts on the stopper 340.

Figure 8:
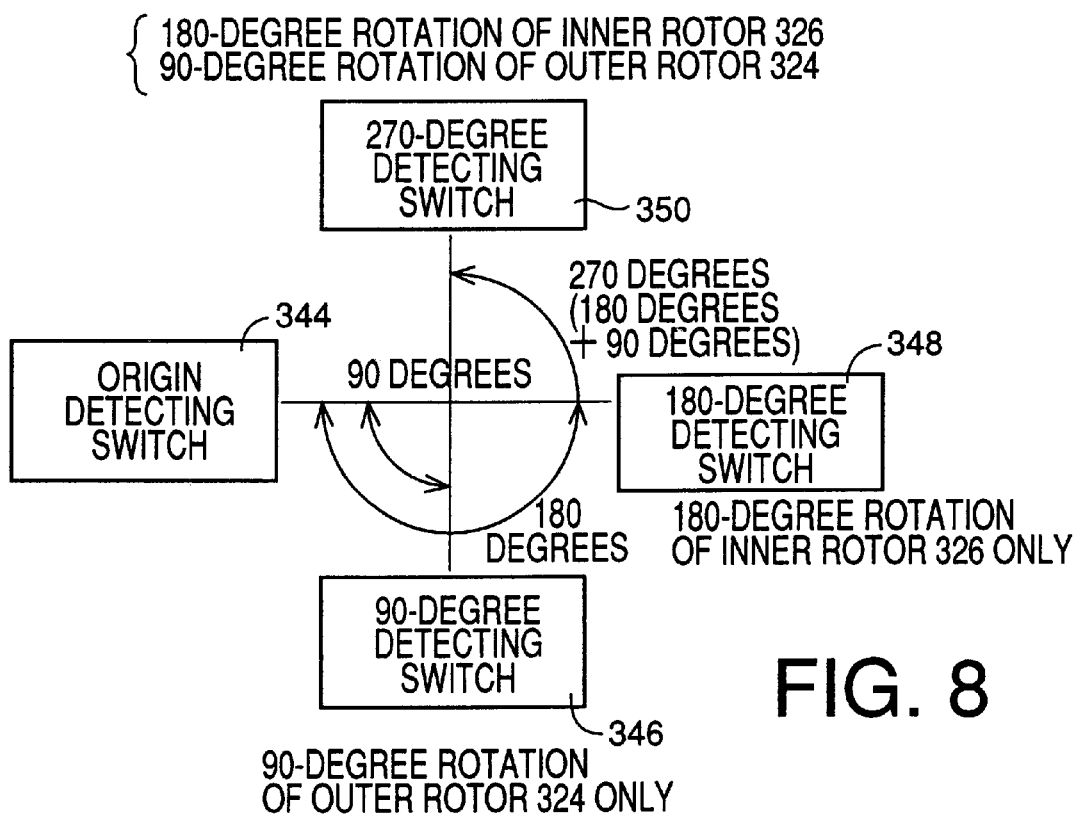
FIG. 8 is a view for explaining the operation of the head rotating device of FIG. 7.

As shown in FIG. 8, an origin detecting switch 344, a 90-degree detecting switch 346, a 180-degree detecting switch 348, and a 270-degree detecting switch 350 are attached to a cover member (not shown) which is fixed to the main body 322 of the head rotating device 320, such that the four switches 344, 346, 348, 350 are equiangularly spaced from one another by 90 degrees. Each of the switches 344 to 350 is provided by a proximity switch, and the cover member is fixed to the main body 322 at such a relative angular phase that when the inner rotor 326 takes its origin and then is rotated from the origin by 90 degrees, 180 degrees, and 270 degrees, the four switches 344, 346, 348, 350 sequentially detects a detectable member 352 provided on the engaging member 342 in the order of description. The detectable member 352 is fixed to an upper surface of an end portion of the engaging member 342 that projects from the output shaft 328, and extends from the engaging member 342 in a direction parallel to the axis line of the output shaft 328.

When the outer rotor 324 is rotated, the engaging member 342 remains engaged with the origin stopper 338, and the inner rotor 326 is rotated with the outer rotor 324 because of the engagement of the engaging member 342 with the origin stopper 338. Thus, as shown in FIG. 8, the output shaft 328 is rotated by 90 degrees. Subsequently, when only the inner rotor 326 is rotated, the output shaft 328 is rotated by 180 degrees. Therefore, the output shaft 328 is rotated by 270 degrees in total. Those rotations are detected when the detectable member 352 is detected by the switches 346 to 350. The output shaft 328 is rotated about the axis line thereof by incremental angles each equal to 90 degrees, so that the EC being held by the component mounting head 314 is rotated about an axis line thereof by incremental angles each equal to 90 degrees.

Figure 9:
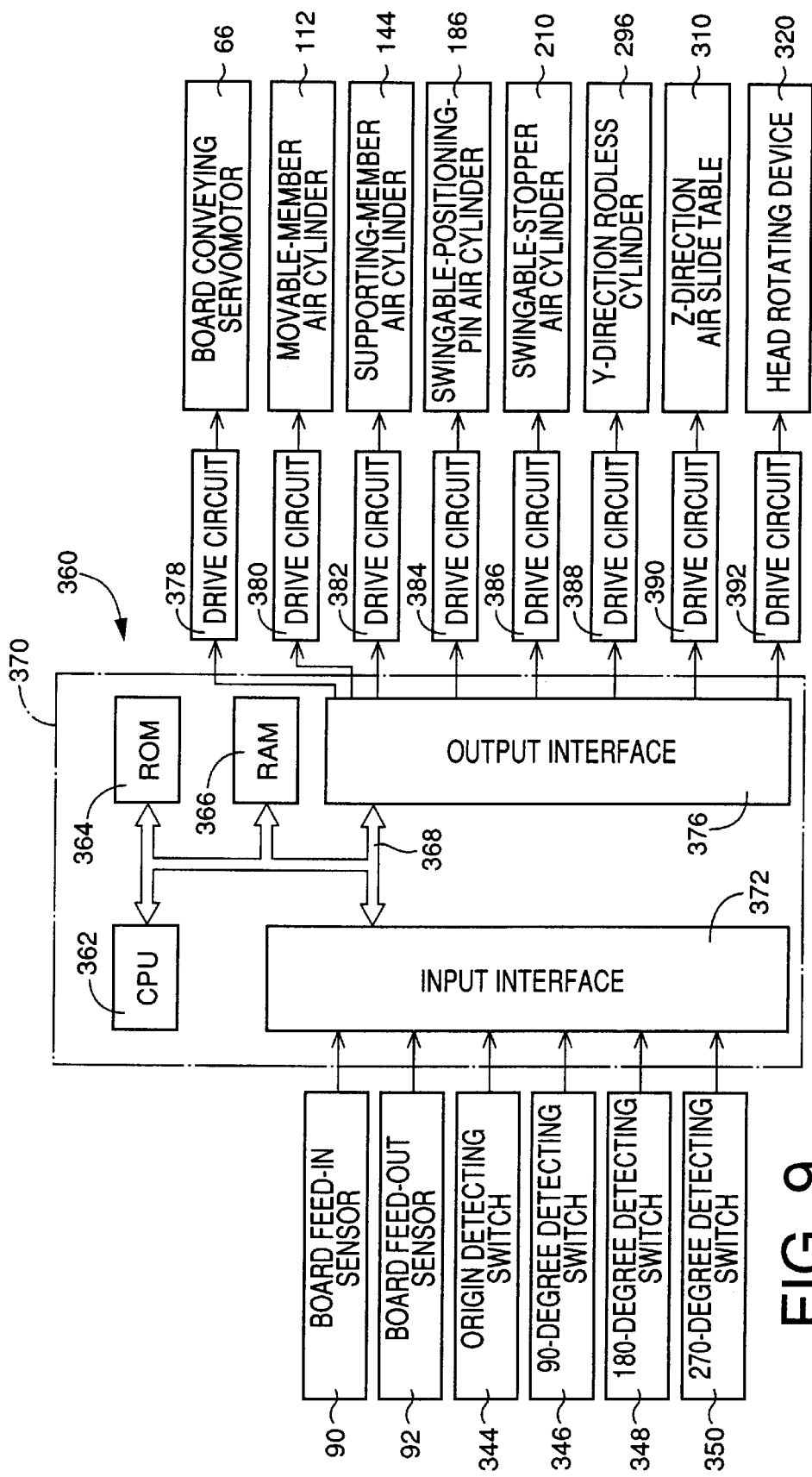
FIG. 9 is a block diagram showing a pertinent portion of a control device of the EC mounting system of FIG. 1.

The present EC mounting system is controlled by a control device 360 shown in FIG. 9. The control device 360 is essentially provided by a computer 370 including a central processing unit (CPU) 362, a read only memory (ROM) 364, a random access memory (RAM) 366, and a bus 368 for connecting those elements 362 to 366 to one another. An input interface 372 is connected to the bus 368, and the board feed-in sensor 90, the board feed-out sensor 92, the origin detecting switch 344, the 90-degree detecting switch 346, the 180-degree detecting switch 348, and the 270-degree detecting switch 350 are connected to the input interface 372. An output interface 376 is connected to the bus 368, and the board conveying servomotor 66, the movable-member air cylinder 112, the supporting-member air cylinder 144, the rotatable-positioning-pin air cylinder 186, the rotatable-stopper air cylinder 210, the Y-direction rodless cylinder 296, the Z-direction air slide table 310, and the head rotating device 320 are connected to the output interface 376 via respective drive circuits 378, 380, 382, 384, 386, 388, 390, 392, respectively. More strictly, each of the cylinders 112, 144, 186, 210, 296 and the two rodless cylinders of the Z-direction air slide table 310 has an air chamber and is associated with a solenoid-operated direction-switchable valve which is switchable under control of the control device 360 to direct the flowing of air into the air chamber. Each of the two rotary air actuators for rotating the inner and outer rotors 326, 324 of the head rotating device 320, respectively, has an air chamber and is associated with a solenoid-operated direction-switchable valve which is switchable under control of the control device 360 to direct the flowing of air into the air chamber.

Figure 10:
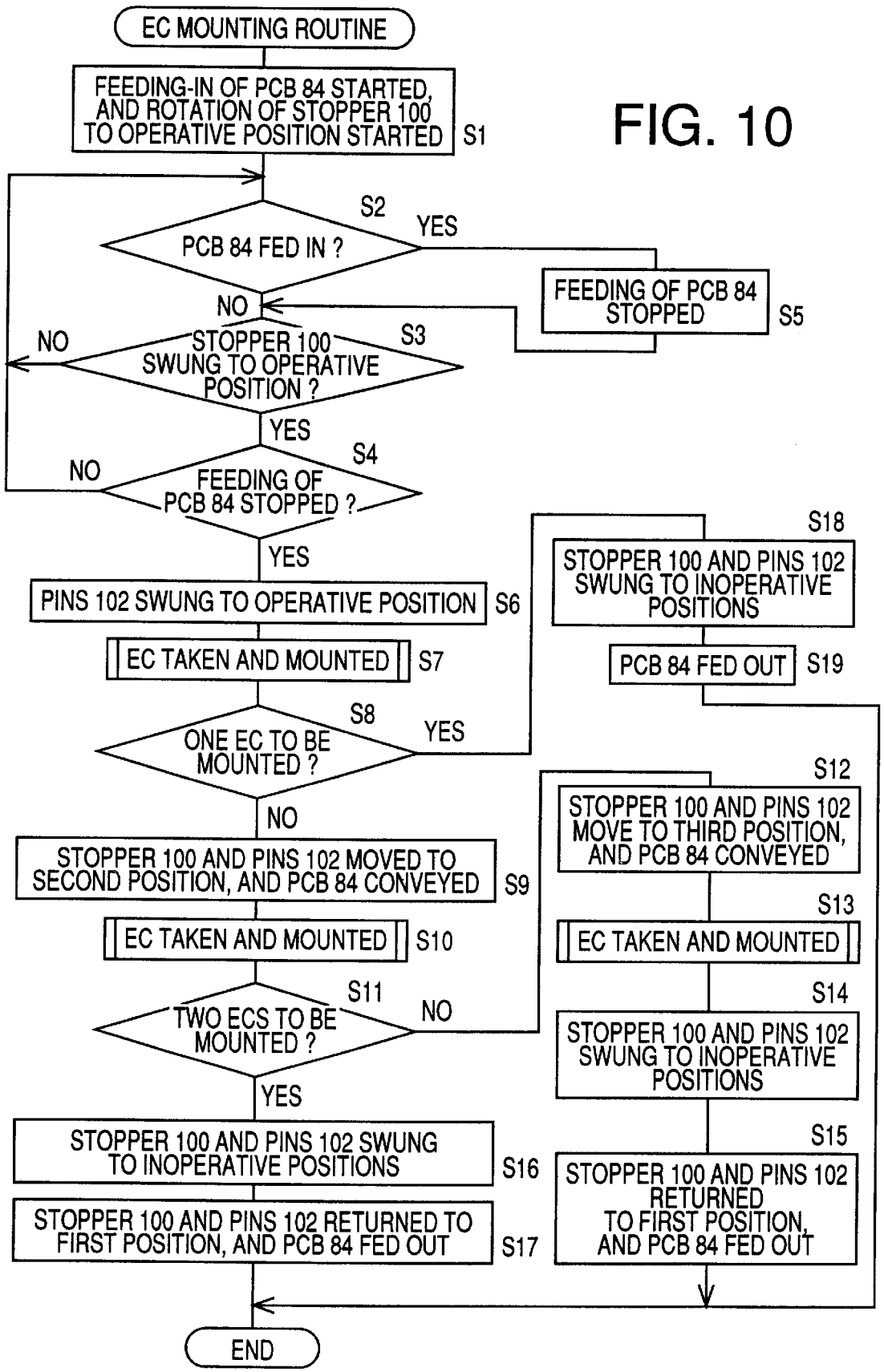
FIG. 10 is a flow chart representing an EC mounting routine which is pre-stored in a read only memory (ROM) of a computer of the control device of FIG. 9.

The ROM 364 stores various control programs which are needed for feeding in and out the PCB 84 and mounting the ECs on the PCB 84, in particular, EC mounting routine represented by the flow chart of FIG. 10.

Hereinafter, there will be described the operation of the present EC mounting system.

Before a PCB 84 is fed in, the X-direction slide member 234 and/or the Y-direction slide member 254 is/are moved so that the component mounting position of the component mounting head 314 is aligned with the predetermined EC mounting position where an EC is mounted on a PCB 84. To this end, an operator loosens the screw members 242 and/or the screw members 262 and rotates the X-direction feeding screw 238 and/or the Y-direction feeding screw 258 so as to move the X-direction slide member 234 and/or the Y-direction slide member 254, and subsequently fastens the screw members 242 and/or 262 to fix the slide 234 and/or the slide 254. The rotatable stopper 100 and the rotatable positioning pins 102 are positioned, in a direction parallel to the board conveying direction, at a first position indicated in solid line in FIGS. 1 and 6, and are both positioned in their inoperative positions.

The mounting of ECs on a PCB 84 is carried out according to the EC mounting routine. The present EC mounting system can mount three ECs at three places, respectively, which are distant from one another on the PCB 84 in a direction parallel to the board conveying direction. First, there will be described the case where three ECs are mounted on the PCB 84.

At Step S1 of the EC mounting routine, the board conveying servomotor 66 is started, and the belts 54 are moved or circulated, so that the conveying or feeding-in of the PCB 84 is started. In addition, the movable-stopper air cylinder 210 is operated so that the rotatable stopper 100 is rotated from the inoperative position thereof toward the operative position thereof. The PCB 84 is supplied from a device which is provided on an upstream side of the PCB supporting and positioning device 12 in the board conveying direction. This device may be provided by an EC mounting apparatus wherein a component mounting head is moved in an X direction and a Y direction so as to mount an EC at a desired place on a PCB; an EC mounting system which has the same construction as that of the present EC mounting system but which mounts ECs of a different sort on a PCB than ECs which are mounted on the PCB by the present EC mounting system; a highly-viscous-fluid applying device (e.g., a screen printing machine or an adhesive dispenser) which applies a highly viscous fluid such as an adhesive or a creamy solder to a PCB 84; or a PCB supplying device which includes a stocker for storing a plurality of PCBs 84 and supplies the PCBs 84 one by one to the PCB supporting and positioning apparatus 12.

Step S1 is followed by Step S2 to judge whether a PCB 84 has been fed in. This judgment is made by judging whether the board feed-in sensor 90 has detected a PCB 84. At an early stage of a control cycle according to the EC mounting program, a negative judgment is made at Step S2. Therefore, the control of the CPU 362 goes to Step S3 to judge whether the rotatable stopper 100 has been moved to its operative position. This judgment is made by judging whether the piston rod 212 of the air cylinder 210 has been moved to its stroke end or limit corresponding to the rotation of the stopper 100 to its operative position. At an early stage of the control cycle, a negative judgment is made at Step S3. Therefore, the control of the CPU 362 goes back to Step S2.

If a positive judgment is made at Step S2, that is, if a PCB 84 has been fed in, the control of the CPU 362 goes to Step S5 to stop the board conveying servomotor 66. Meanwhile, if a positive judgment is made at Step S3, that is, if the rotatable stopper 100 is rotated to its operative position, the control of the CPU 362 goes to Step S4 to judge whether the conveying of the PCB 84 has been stopped, i.e., whether the servomotor 56 has been stopped. Thus, no additional action is carried out after the rotatable stopper 100 has been rotated to its operative position and before the PCB 84 has been conveyed to a position where the PCB 83 is detected by the feed-in sensor 90. Usually, the rotatable stopper 100 is rotated to its operative position before the PCB 84 is conveyed to the position where the PCB 84 is detected by the feed-in sensor 90. After the feeding-in of the PCB 84 is detected by the feed-in sensor 90, the PCB 84 is brought into contact with the rotatable stopper 100, so that the movement of the PCB 84 is stopped.

The CPU 362 quits each of Steps S6, S9, S12, S14 to S19, after it has confirmed that the corresponding task or tasks has or have been completed, by employing steps (not shown) like Steps S2 and S3. For example, the sensors accommodated in the stoppers 120, 122, 154, 156 are used for confirming that the movable member 108 and the supporting member 140 have been moved to their one movement ends or limits, i.e., that the rotatable stopper 100 and the rotatable positioning pins 102 have been moved to a second and a third position in the board conveying direction which will be described later. The sensors accommodated in the rotatable-stopper air cylinder 210 and the rotatable-positioning-pin air cylinder 186 are used for confirming that the respective piston rods of the cylinders 210, 186 have been moved to their one stroke ends or limits corresponding to the respective rotations of the stopper 100 and the pins 102 to their operative positions.

The feeding out of the PCB 84 is detected by the feed-out sensor 92. A device which receives the PCB 84 fed out by the board conveying device 20 is provided on a downstream side of the PCB supporting and positioning device 12 in the board conveying direction. This device may be provided by an EC mounting system which has the same construction as that of the present EC mounting system but which mounts ECs of a different sort on the PCB 84 than the ECs which are mounted on the PCB 84 by the present EC mounting system; or a PCB receiving device which includes a stocker for receiving the PCBs 84 on each of which the ECs have been mounted.

When the rotatable stopper 100 has been rotated to its operative position and a PCB 84 has been fed in, a positive judgment is made at Step S4 and the control of the CPU 362 goes to Step S6 to operate the rotatable-positioning-pin air cylinder 186 to rotate the two rotatable positioning pins 102 from their inoperative position to their operative position in which the two pins 102 fit in the two positioning holes 196 of the PCB 84.

Step S6 is followed by Step S7 to operate the component mounting head 314 to grasp an EC and mount the EC on the PCB 84. The CPU 362 reads an EC taking and mounting subroutine (not shown) from the ROM 364 and, according to the subroutine, takes the EC from the cartridge 270 and mounts the EC on the PCB 84. This subroutine is also designed such that the control of the CPU 362 does not proceed from one step to another step before it has confirmed using the various sensors that the corresponding task or tasks has or have been completed at that one step. For example, the sensors are used for confirming that the component mounting head 314 has been moved to the component receiving position, the component mounting position, the upper dead (or limit) position, or the lower dead (or limit) position.

The component mounting head 314 had been returned to, and has been held at, the component receiving position after the head 314 mounted the preceding or prior EC. After the PCB 84 is positioned, the Z-direction air slide table 310 is moved downward to grasp the current EC following the above-indicated prior EC. After grasping the EC, the mounting head 314 is moved upward to its upper limit position where the mounting head 314 is further moved to the component mounting position by the Y-direction rodless cylinder 296. During this Y-direction movement, the mounting head 314 is rotated, as needed, by the head rotating device 320, so that the EC is rotated about the axis line thereof so as to change its posture. After the Y-direction movement, the mounting head 314 is moved down so as to mount the EC at a prescribed EC fixing position on the PCB 84. After the EC mounting, the mounting head 314 is moved up and then moved to the component receiving position.

Step S7 is followed by Step S8 to judge whether the number of EC or ECs to be mounted on the PCB 84 is one. The number of EC or ECs to be mounted on the PCB 84 can be known from the EC mounting program which additionally prescribes the number of PCB or PCBs 84 on which EC or ECs is or are to be mounted, the sort or sorts of PCB or PCBs 84 on which EC or ECs is or are to be mounted, the EC fixing position or positions on the PCB or PCBs 84, and the sort or sorts of EC or ECs to be mounted. Since three ECs are to be mounted on the PCB 84, a negative judgment is made at Step S8, and the control of the CPU 362 goes to Step S9 to displace, in a direction parallel to the board conveying direction, the rotatable stopper 100 and the rotatable positioning pins 102 to their second position indicated in one-dot chain line in FIG. 6. More specifically described, the piston rod 146 of the supporting-member air cylinder 144 is retracted, and the supporting member 140 is moved relative to the movable member 108 in the direction parallel to the board conveying direction while being guided by being guided by the guide rail 106. This movement of the supporting member 140 is stopped when the stopper 156 attached to the connecting member 148 butts on the butting members 158. Thus, the stopper 100 and the pins 102 are positioned at their second position.

The distance between the first position indicated in solid line and the second position indicated in one-dot chain line is equal to one third of the length of the PCB 84 in the direction parallel to the board conveying direction. Before the present EC mounting operation is started, the position of the butting members 158 is so adjusted as to permit the supporting member 140 to be moved by the distance equal to one third of the length of the PCB 84.

When the stopper 100 and the pins 102 are moved from the first position to the second position, they remain in their operative positions. Accordingly, the PCB 84 is moved with the pins 102. This movement is permitted because the belts 54 of the board conveying device 20 are moved or circulated at the same speed as that of the movable member 108. Thus, the PCB 84 is also positively conveyed by the belts 54.

Step S9 is followed by Step S10 where the component mounting head 314 mounts the EC on the PCB 84 at the same component mounting position as that at which the head 314 mounted the prior EC on the same PCB 84 at Step S7. Assuming that the PCB 84 consists of three one-third portions each having the same length in the direction parallel to the board conveying direction, the mounting head 314 mounts the current EC at the same EC fixing position on the middle one-third portion as that on the most downstream one-third portion where the prior EC had been mounted.

Subsequently, at Step S11, the CPU 362 judges whether the number of ECs to be mounted on the PCB 84 is two. Under the above-indicated assumption, a negative judgment is made at Step S11, and the control of the CPU 362 goes to Step S12 to displace the stopper 100 and the pins 102 to their third position indicated in two-dot chain line in FIG. 6. More specifically described, the piston rod 114 of the movable-member air cylinder 112 is retracted, and the movable member 108 is moved in the board conveying direction. Thus, the air cylinder 144 mounted on the movable member 108 is moved with the movable member 108, and the supporting member 140 connected to the air cylinder 144 is moved through the board conveying route.

The above movement of the movable member 108 is stopped when the butting members 126 butt on the stopper 122. The distance between the second position indicated in one-dot chain line and the third position indicated in two-dot chain line is equal to one third of the length of the PCB 84 in the direction parallel to the board conveying direction. Before the present EC mounting operation is started, the position of the butting members 126 is so adjusted as to permit the stopper 100 and the pins 102 to be moved by the distance equal to one third of the length of the PCB 84. When the stopper 100 and the pins 102 are moved from the second position to the third position, they remain in their operative positions. During this movement, the board conveying servomotor 66 is operated, and the PCB 84 is positively conveyed by the belts 54.

Step S12 is followed by Step S13 where the component mounting head 314 mounts the EC on the PCB 84 at the same component mounting position as that at which the head 314 mounted the prior two ECs on the same PCB 84 at Steps S7 and S10. The mounting head 314 mounts the current EC at the same EC fixing position on the most upstream one-third portion as those on the most downstream and middle one-third portions where the prior two EC had been mounted.

Subsequently, at Step S14, the CPU 362 operates for rotating the stopper 100 and the pins 102 to their inoperative positions and, at Step S15, the CPU 362 operates for returning the stopper 100 and the pins 102 to their first position. More specifically described, the piston rod 114 of the movable-member air cylinder 112 is extended, so that the movable member 108 is moved in a direction opposite to the board conveying direction, while the piston rod 146 of the supporting-member air cylinder 144 is extended, so that the supporting member 140 is also moved in the same direction that is opposite to the board conveying direction. Simultaneously, the board conveying servomotor 66 is operated, so that the PCB 84 is fed out.

Thus, one control cycle according to the present routine terminates. The timing at which the PCB 84 is fed out can be identified when the light detector of the board feed-out sensor 92 detects the light emitted by the light emitter of the same 92 and subsequently reflected by the PCB 83 and then first stops detecting the light because the PCB 84 has passed by the sensor 92.

Next, there will be described the case where two ECs are mounted on a PCB 84.

Figure 11:
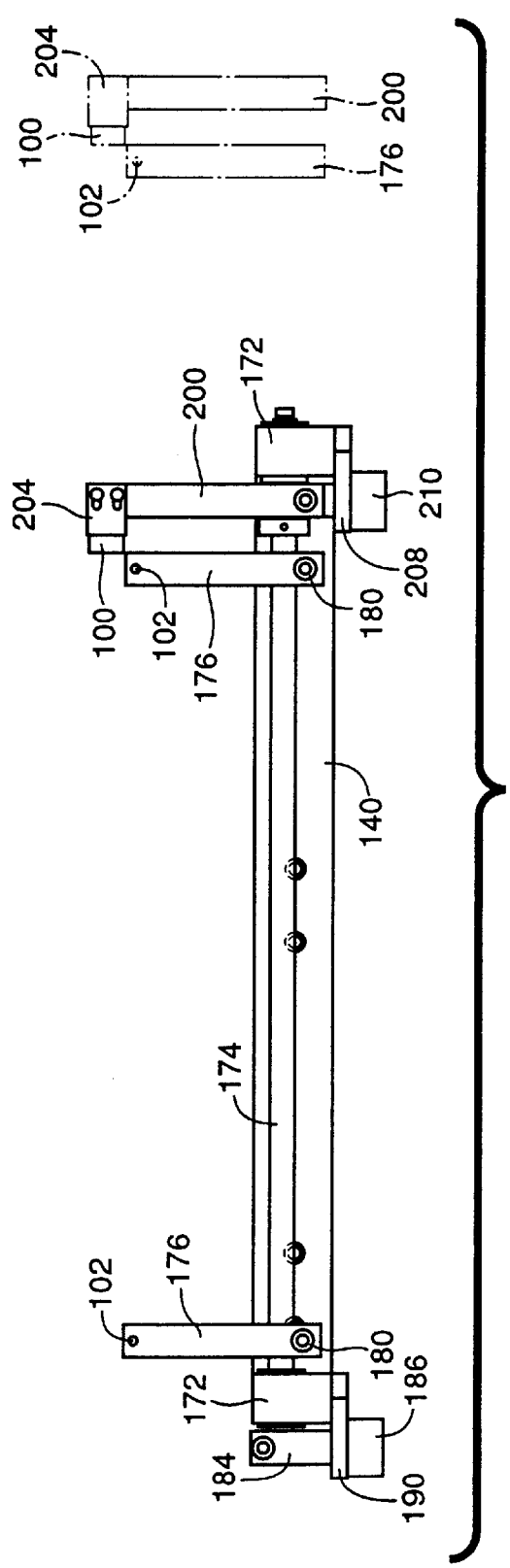
FIG. 11 is a view showing two positions which are taken by the rotatable stopper and the rotatable positioning pins when two ECs are mounted at two places distant from each other on a PCB in the direction of conveying of PCBs.

In this case, a negative judgment is made at Step S8, and Step S9 is carried out to move the stopper 100 and the pins 102 to their second position. However, this second position is not the second position indicated in one-dot chain line in FIG. 6, but a different second position indicated in one-dot chain line in FIG. 11. This second position is distant from the first position in the board conveying direction by a distance equal to half the length of the PCB 84 in the same direction. In this case, too, the supporting member 140 is moved by the air cylinder 144, like in the case where three ECs are mounted on a PCB 84. The position of the butting members 158 is adjusted in advance so as to permit the supporting member 140 to be moved by half the length of the PCB 84 in the board conveying direction.

After the stopper 100 and the pins 102 are moved to their different second position, the component mounting head 314 mounts the EC on the PCB 84. Subsequently, the control of the CPU 362 goes to Step S11 to judge whether the number of ECs to be mounted on the PCB 84 is two. In this case, a positive judgment is made at Step S11, and the control of the CPU 362 goes to Step S16 to rotate the stopper 100 and the pins 102 to their inoperative positions and then goes to Step S17 to return the stopper 100 and the pins 102 to their first position. The piston rod 146 of the supporting-member air cylinder 144 is extended, so that the supporting member 140 is moved in the direction opposite to the board conveying direction. Simultaneously, the PCB 84 is fed out. Thus, one control cycle according to the present routine ends.

In the case where just one EC is mounted on a PCB 84, a positive judgment is made at Step S8, and the control of the CPU 362 goes to Step S18 to rotate the stopper 100 and the pins 102 to their inoperative positions and then goes to Step S17 to return the stopper 100 and then goes to Step S19 to feed out the PCB 84. Thus, one control cycle according to the present routine ends.

As is apparent from the foregoing description, in the EC mounting system in accordance with the present invention, the X-direction slide member 234 and the Y-direction slide member 254 are moved in advance so that the component mounting position of the component mounting head 314 is aligned with the predetermined EC fixing or mounting position on the PCB 84. Therefore, the EC can be quickly mounted on the PCB 84 by moving the mounting head 314 between the component receiving position and the component mounting position through a straight route having a predetermined length.

In the case where two or three ECs are mounted on a single PCB 84, the single PCB 84 may be divided, after all the ECs are mounted thereon, into two or three divided PCBs such that the division line or lines is or are perpendicular to the board conveying direction. If the PCB 84 is not divided, the PCB 84 has the two or three same EC mounting patterns thereon.

Figure 12:
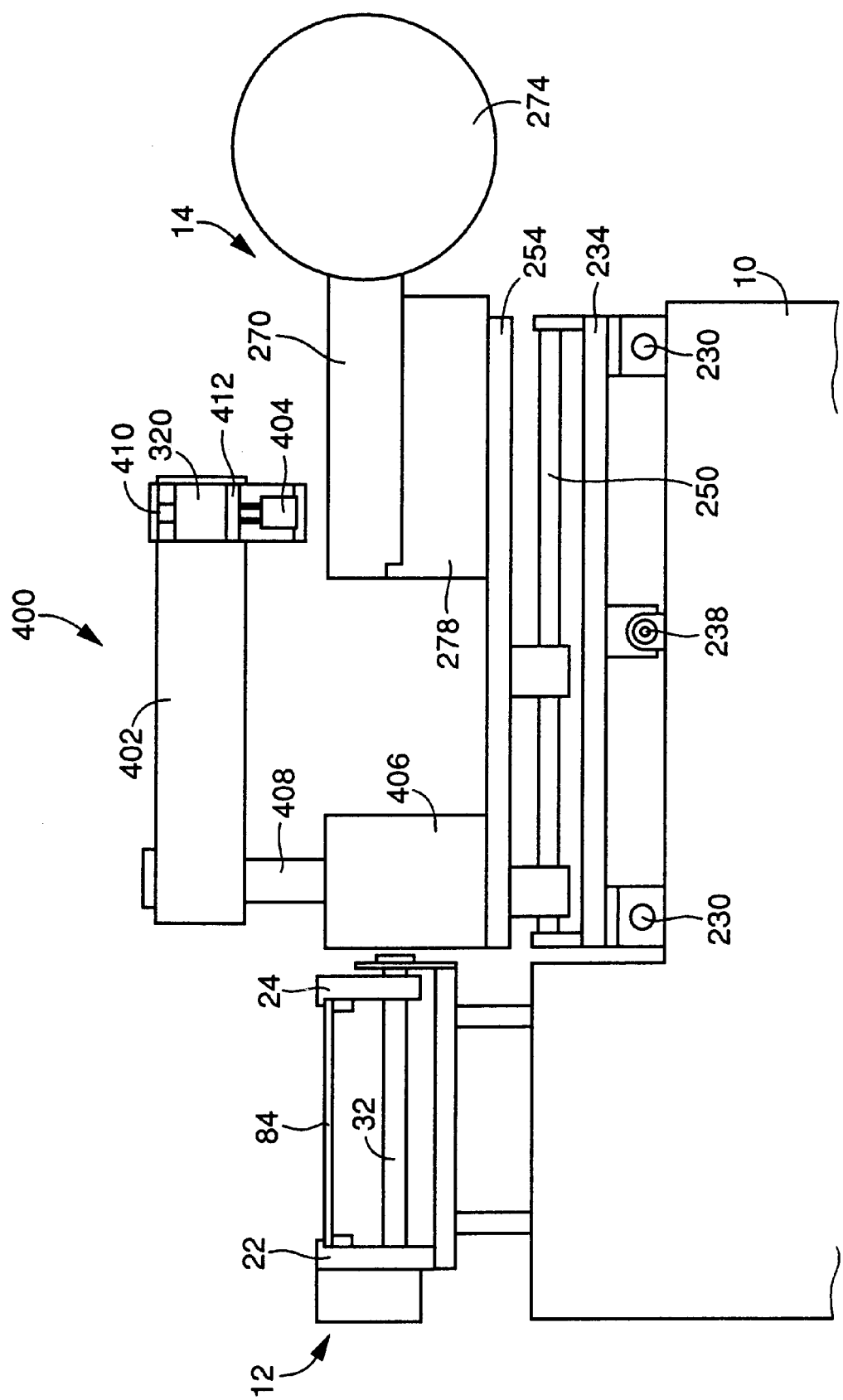
FIG. 12 is an illustrative side elevation view of another EC mounting system as a second embodiment of the present invention.

Next, there will be described another EC mounting system as a second embodiment of the present invention, by reference to FIG. 12. The present EC mounting system is different from the first EC mounting system illustrated in FIGS. 1–11 in that the present system employs an EC mounting apparatus 400 illustratively shown in FIG. 12 in place of the EC mounting apparatus 16 including the component mounting head 314 which is linearly moved between the component receiving and mounting positions by the Y-direction rodless cylinder 296. The EC mounting apparatus 400 includes a component mounting head 404 which is rotated about an axis line parallel to the Z direction when a rotatable arm 402 is rotated about the axis line.

The EC mounting apparatus 400 additionally includes a rotary air cylinder 406 which is provided, on the Y-direction slide member 254, near to the PCB supporting and positioning apparatus 12. The air cylinder 406 has a vertical output shaft 408 to which one end of the rotatable arm 402 is fixed. The rotatable arm 402 is rotatable by the air cylinder 406 by 180 degrees in each of opposite directions thereabout.

A Z-direction air slide table 410 is attached to a free end of the rotatable arm 402 such that the slide table 410 extends in the Z direction. A supporting member 412 is fixed to a table member fixed to a movable member of a rodless cylinder as part of the slide table 410. The rotatable arm 402 is rotated by the air cylinder 406, so that the component mounting head 404 is moved to a component receiving position corresponding to the component-supply portion of the cartridge 270, and to a component mounting position corresponding to the EC mounting position on the PCB 84. The mounting head 404 and the cartridge 270 are provided such that while the rotatable arm 402 takes an angular position corresponding to the component receiving position of the mounting head 404, the mounting head 404 is aligned with the component-supply portion of the cartridge 270. The second EC mounting system has the same construction as that of the first EC mounting system except for the above-described differences. The same reference numerals as used in FIGS. 1–11 for the first EC mounting system are used to designate the corresponding elements or parts of the second EC mounting system, and the description thereof is omitted.

Before an EC mounting operation is started, the respective positions of the X-direction and Y-direction slide members 234, 254 are adjusted so that while the rotatable arm 402 takes an angular position corresponding to the component amounting position of the mounting head 404, the mounting head 404 is aligned with the component mounting position on the PCB 84. When the mounting head 404 receives an EC, the rotatable arm 402 takes the angular position, shown in FIG. 12, corresponding to the component receiving position of the mounting head 404. At the component receiving position, the mounting head 404 is moved downward to grasp the EC. After the EC grasping, the mounting head 404 is moved upward and subsequently is rotated by 180 degrees in one direction to the component mounting position. After this rotation, the mounting head 404 is moved downward to mount the EC on the PCB 84. After the EC mounting, the mounting head 404 is moved upward and then is rotated by 180 degrees in the opposite direction to the component receiving position.

Next, there will be described another EC mounting system as a third embodiment of the present invention, by reference to FIGS. 13 and 14. The present EC mounting system is different from the first EC mounting system illustrated in FIGS. 1–11 in that the present system employs an EC mounting apparatus 418 illustratively shown in FIGS. 13 and 14 in place of the EC mounting apparatus 16. The EC mounting apparatus 418 includes a component mounting head 420 which is moved between its component receiving and mounting positions by a servomotor 422. In the third EC mounting system, an X-direction slide member 424 is moved when an operator manually rotates an X-direction feeding screw 428, and is clamped with an X-direction clamping device (not shown), and a Y-direction slide member 426 is moved when the operator manually rotates a Y-direction feeding screw (not shown), and is clamped with a Y-direction clamping device (not shown), like in the first EC mounting system.

An EC supplying cartridge ("cartridge") 432 is attached to a cartridge supporting table 430 fixed to the Y-direction slide member 426, such that the cartridge 432 projects toward the PCB supporting and positioning apparatus 12. In a state in which the Y-direction slide member 426 takes the nearest position to the apparatus 12, the component-supply portion of the cartridge 432 corresponds to the middle portion of the PCB 84 in the Y direction.

An upright column 436 which is provided on the Y-direction slide member 426 includes an arm 438 which projects over the component-supply portion of the cartridge 432 and hangs over the PCB supporting and positioning apparatus 12. A ball screw 440 as a feeding screw is provided on a vertical side surface of a free end portion of the projecting arm 438, such that the ball screw 440 extends parallel to the Y direction. A movable table 442 is threadedly engaged with the ball screw 440 via a nut fixed thereto. A Z-direction air slide table 444 is mounted on the movable table 442, and a supporting member 446 which supports the component mounting head 420 is attached to a table member 445 fixed to a movable member of a rodless cylinder as part of the slide table 444. When the ball screw 440 is rotated by the servomotor 442 as a drive source, the movable table 442 is moved in the Y direction while being guided by a pair of guide rails 450, so that the mounting head 420 is moved between the component receiving and mounting positions. The range of movement of the mounting head 420 is substantially equal to the Y-direction dimension of each of at least four sub-areas obtained by equally dividing an EC mounting area on the PCB 84 with at least one dividing line parallel to the X direction and at least one dividing line parallel to the Y direction. Reference numeral 452 designates a head rotating device.

Figure 14:
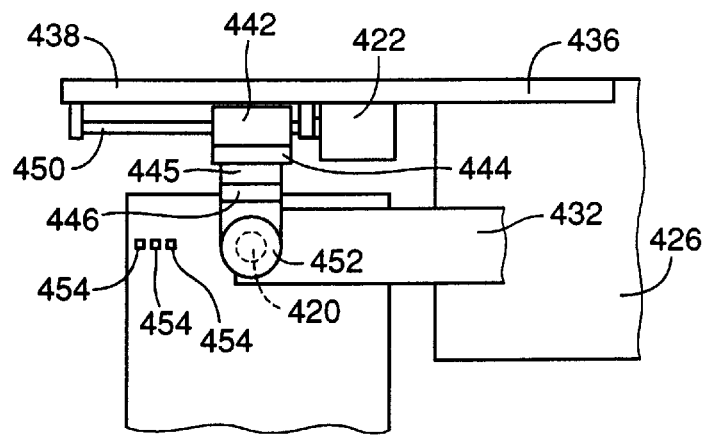
FIG. 14 is an illustrative plan view of the EC mounting system of FIG. 13.

As shown in FIG. 14, the component mounting head 420 mounts an EC at each of a plurality of EC mounting positions 454, indicated at rectangles, which are arranged at small intervals in the Y direction within each sub-area on the PCB 84. To this end, before an EC mounting operation is started, an operator manually operates or rotates the feeding screws for moving the X-direction and Y-direction slide members 424, 426, so that the component mounting head 420 and the component-supply portion of the cartridge 432 are moved to a position right above one of the sub-areas on the PCB 84.

When an EC is mounted on the PCB 84, the component mounting head 420 is moved to the component receiving position where the mounting head 420 is moved downward to grasp the EC. After the EC grasping, the mounting head 420 is moved upward. Subsequently, the servomotor 422 is operated, so that the mounting head 420 is moved to a position right above one of the EC mounting positions which is the nearest to the component receiving position in the Y direction, and mounts the EC at the nearest position. After the EC mounting, the mounting head 420 is moved to the component receiving position so as to grasp another EC, and then is moved in the Y direction to a position right above another EC mounting position adjacent to the nearest EC mounting position so as to mount the EC at the second nearest position.

In the third EC mounting system, the component mounting head 420 and the component-supply portion of the cartridge 432 project from the Y-direction slide member 426 and hang over the PCB supporting and positioning apparatus 12, and can be moved by the X-direction and Y-direction slide members 424, 426 to a position right above any of the plurality of sub-areas on the PCB 84. Thus, the mounting head 420 is iteratively moved between the component-supply portion of the cartridge 432 and each of the EC mounting positions within each sub-area, over short distances which are not longer than the dimension of each sub-area in the Y direction. Thus, the mounting head 420 can quickly mount a plurality of ECs at a plurality of EC mounting positions which are near to each other in the Y direction.

While the present invention has been described in its preferred embodiments, the present invention may otherwise be embodied.

For example, although in each of the first to third embodiments the rotatable stopper 100 and the rotatable positioning pins 102 are moved to the second or third position while being held at their operative positions, and simultaneously the PCB 84 is conveyed by the board conveying device 20, it is possible to move the stopper 100 and the pins 102 being back at their inoperative positions, to the second or third position, and then rotate the stopper 100 and the pins 102 to their operative position. In the latter case, when the stopper 100 and the pins 102 are moved to the second or third position, the PCB 84 is conveyed by the board conveying device 20. After the movement of the PCB 84 is stopped by the stopper 100, the operation of the board conveying device 20 is stopped and the pins 102 are rotated to its operative position.

Alternatively, it is possible to move the stopper 100 and the pins 102 being held held at their operative positions, to the second or third position, while not operating the board conveying device 20 for moving the belts 54 or the PCB 84. In this case, the PCB 84 is conveyed by the pins 102 only.

In each of the illustrated embodiments, the supporting-member air cylinder 144 is operated for moving the supporting member 140 to the second position relative to the movable member 108, and the movable-member air cylinder 112 is operated for moving the movable member 108 and thereby moving the supporting member 140 to the third position. However, the movable-member air cylinder 112 may be operated for moving the movable member 108 and thereby moving the supporting member 140 to the second position, and the supporting-member air cylinder 144 may be operated for moving the supporting member 140 to the third position relative to the movable member 108.

Each of the movable-member air cylinder 112 and the supporting-member air cylinder 144 may be replaced by a rodless cylinder. Each of the Y-direction rodless cylinder 296 and the Z-direction air slide table 310 which move the component mounting head 314 in the Y direction and the Z direction, respectively, may be replaced by an air cylinder having a piston rod.

Figure 13:
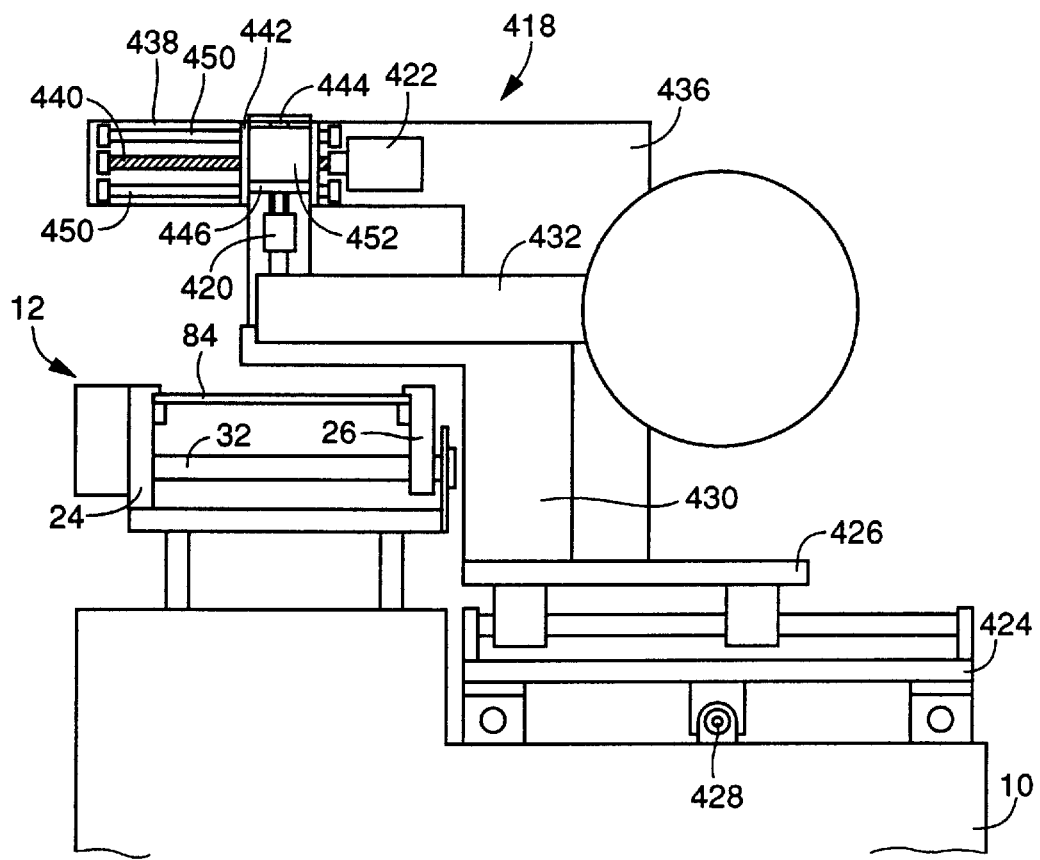
FIG. 13 is an illustrative side elevation view of yet another EC mounting system as a third embodiment of the present invention.

In the third embodiment shown in FIGS. 13 and 14, the component mounting head 420 may be adapted such that the mounting head 420 can be moved by a servomotor as a drive source in the X direction as well. In this case, the mounting head 420 is movable in both the X and Y directions on the arm 438, and can quickly mount ECs at a plurality of positions which are near to each other in the X direction and at a plurality of positions which are near to each other in the Y direction, within each of a plurality of sub-areas obtained by dividing an EC mounting area on an PCB 84.

The rotatable stopper 100 may be adapted such that the stopper 100 is rotatable to its operative and inoperative positions about an axis line perpendicular to the X-Y plane parallel to the reference plane on which the PCB 84 is supported by the board conveying device 20.

In each of the illustrated embodiments, an image pick-up device such as a CCD (charge coupled device) camera may be provided midway on the EC conveying route of the EC mounting apparatus 16, 400, 418 provided on the movable table 234, 254; 424, 426. The image pick-up device takes an image of the EC which is conveyed by the mounting head 314, 404, 420, and the control device 460 operates for correcting the posture of the EC based on the taken image. Although an image of the EC being held by the mounting head may be taken at an image taking position between the component-supply portion of the cartridge 270, 432, and the EC mounting or fixing position on the EC 84. However, it is possible to take an image of the EC which is being moved. In the latter case, the image pick-up device may be provided by a stroboscopic high-speed camera, or a "line" sensor. The stroboscopic high-speed camera emits intense light to an EC when the EC passes by it, and takes an image of the EC. The EC is moving, but its image can be taken as if it were stationary, by employing a very high shutter speed or a very short light emission duration. The "line" sensor includes a number of image pick-up elements arranged in a straight array, and is disposed such that the array of elements extends in a direction perpendicular to the EC conveying route. The line sensor takes an image of the EC being moved, at regular intervals of time, that is, takes respective "line" images of successive portions of the EC as the EC passes by the sensor. At the time the EC just passes by the sensor, the sensor just obtains all the images of the EC. A two-dimensional image of the EC can be obtained by the combination of the iterative line imaging of the line sensor and the movement of the EC by the mounting head. In those cases, the head rotating device 320 which rotates the mounting head may be driven by a servomotor which can rotate an EC held by the head by a desired angle about an axis line thereof and thereby correct an incorrect angular position of the EC about its axis line.

In each of the first and second embodiments, it is possible to employ at least one additional EC mounting system which mounts, on a PCB 84, ECs of the same sort as that of the ECs mounted by the first or second EC mounting system but which mounts the ECs at a component mounting position different from that of the first or second EC mounting system in a direction perpendicular to the board conveying direction. In this case, after all the ECs are mounted on the PCB 84, the PCB 84 may be divided into at least four PCBs by being cut in both the board conveying direction and the direction perpendicular to the board conveying direction.

The PCB supporting and positioning device 12 may be used in combination with an EC mounting apparatus including a component mounting head which is movable in both an X direction and a Y direction perpendicular to each other so as to mount ECs on a PCB 84. For example, the present combination is advantageously employed in the case where a plurality of identical electronic circuits are fabricated on a single PCB and subsequently the PCB is divided into a plurality of independent PCBs supporting the plurality of electronic circuits, respectively. More specifically described, while the PCB supporting and positioning device 12 moves and stops the single PCB to and at each of a plurality of positions, the EC mounting apparatus iteratively mounts ECs on each of the sub-areas of the EC mounting area on the PCB according to the same and one EC mounting control program. In this case, the EC mounting apparatus may be reduced in size and the control program may be simplified.

The present invention may be embodied by combining one or more appropriate elements of each one of the illustrated embodiments with one or more appropriate elements of one or more other embodiments.

It is to be understood that the present invention may be embodied with other changes, improvements, and modifications that may occur to those skilled in the art without departing from the scope and spirit of the invention defined in the appended claims.

What is claimed is:

1. An electronic-component mounting system, comprising:
   a printed-circuit-board supporting device which positions and supports a printed circuit board;
   a movable table which is movable, relative to the printed-circuit-board supporting device, in at least one of an X direction and a Y direction which are perpendicular to each other and cooperate with each other to define an X-Y plane parallel to a board-support plane on which the printed circuit board is supported by the supporting device;
   an electronic-component supplying device which is mounted on the movable table and which includes a component-supply portion from which electronic components are supplied one by one;
   an electronic-component mounting device which is mounted on the movable table together with the electronic-component supplying device and which comprises a component mounting head which receives at a component receiving position the electronic components one by one from the component-supply portion of the electronic-component supplying device and mounts at a component mounting position at least one of the electronic components on the printed circuit board positioned and supported on the board-support plane by the printed-circuit-board supporting device, the electronic-component mounting device further comprising a head moving device which is connected to the component mounting head and which moves the mounting head relative to the movable table to the component receiving position and to the component mounting position, the component receiving position and the component mounting position being distant from each other in one of the X and Y directions; and
   a manual table moving device which is connected to the movable table and which is manually operated to move the movable table in said at least one of said X direction and said Y direction, wherein the electronic-component mounting device further comprises a head guide which extends between the component-supply portion of the electronic-component supplying device and the printed-circuit-board supporting device along a straight line parallel to said one of the X and Y directions, the component mounting head is supported by the head guide and is movable relative to the head guide, and the head moving device comprises a fluid-pressure-operated cylinder device which moves the component mounting head, along the head guide, to the component receiving position and to the component mounting position.

2. The system according to claim 1, wherein the printed-circuit-board supporting device comprises a board conveying device which conveys the printed circuit board through a board conveying route because of friction produced between the board conveying device and the board; a stopper which is displaceable to physically contact the printed circuit board conveyed by the board conveying device and thereby stop the movement of the board; a stopper displacing device which displaces the stopper to a first stopper position thereof where the stopper stops the movement of the printed circuit board and to a second stopper position thereof distant from the first position; a plurality of positioning pins each of which fits in a corresponding one of a plurality of positioning holes of the printed circuit board stopped by the stopper, to position the board; and a positioning-pin displacing device which displaces the positioning pins to a first positioning pin position thereof where the positioning pins fit in the positioning holes of the printed circuit board and to a second positioning pin position thereof distant from the first positioning pin position.

3. The system according to claim 2, wherein the printed-circuit-board supporting device comprises a supporting member which supports the stopper, the stopper displacing device, the positioning pins, and the positioning-pin displacing device and which is movable in a direction parallel to the board conveying route; and a supporting-member moving device which moves the supporting device in the direction parallel to the board conveying route.

4. The system according to claim 3, wherein the supporting-member moving device comprises at least one fluid-pressure-operated cylinder device.

5. The system according to claim 2, wherein the board conveying route comprises a straight route parallel to an other of the X and Y directions, and wherein the electronic-component mounting device comprises a component-mounting-head guide which extends between the component-supply portion of the electronic-component supplying device and the printed-circuit-board supporting device along a straight line parallel to said one of the X and Y directions.

6. The system according to claim 2, wherein the stopper comprises a swingable stopper which is swingable to the first and second stopper positions thereof about an axis line parallel to the X-Y plane, and wherein the stopper displacing device comprises a stopper swinging device which swings the swingable stopper to the first and second stopper positions thereof.

7. The system according to claim 2, wherein the plurality of positioning pins are attached to a plurality of pin supporting arms, respectively, which project from a rotatable shaft rotatable about an axis line parallel to the X-Y plane and which are swung when the rotatable shaft is rotated, the positioning pins being swung to the first and second positioning-pin positions thereof when the pin supporting arms are swung, and wherein the positioning-pin displacing device comprises a rotatable-shaft rotating device which rotates the rotatable shaft.

8. The system according to claim 7, wherein at least one of the plurality of pin supporting arms is movable relative to the rotatable shaft and a position of said one arm relative to the rotatable shaft in an axial direction parallel to the axis line of the rotatable shaft is changeable by movement of said one arm relative to the shaft in said axial direction.

9. The system according to claim 3, wherein the supporting-member moving device comprises a movable member which is movable in the direction parallel to the board conveying route; a supporting-member-related fluid-pressure-operated cylinder device which is provided between the movable member and the supporting member and which moves the supporting member relative to the movable member; and a movable-member-related fluid-pressure-operated cylinder device which is provided between the movable member and an immovable member and which moves the movable member relative to the immovable member.

10. The system according to claim 9, wherein the supporting-member moving device further comprises a guide member which guides each of the supporting member and the movable member in the direction parallel to the board conveying route.

11. The system according to claim 10, wherein the supporting member and the movable member at least partly overlap each other in a direction parallel to the guide member.

12. The system according to claim 11, wherein the supporting member and the movable member comprise respective overlapping portions which overlap each other in the direction parallel to the guide member, wherein one of the respective overlapping portions of the supporting member and the movable member has an opening, and wherein the supporting-member moving device further comprises a connecting projection which projects from an other of the respective overlapping portions and extends through the opening from one of opposite sides of said one overlapping portion in a direction perpendicular to the guide member, to an other of said opposite sides, and the supporting-member-related fluid-pressure-operated cylinder device is connected to the connecting projection and one of the supporting member and the movable member which includes said one overlapping portion having said opening, the opening having, in the direction parallel to the guide member, a dimension which allows the connecting projection to be moved relative to said one of the supporting member and the movable member.

13. The system according to claim 1, wherein the electronic-component mounting device further comprises a head holder which holds the component mounting head and allows the mounting head to be moved in a Z direction perpendicular to the X-Y plane and which is supported by the head guide and is movable relative to the head guide; and a Z-direction moving device which moves the component mounting head relative to the head holder in the Z direction.

14. The system according to claim 1, wherein the electronic-component mounting device further comprises a swingable arm which is swingable about an axis line parallel to a Z direction perpendicular to the X-Y plane and which supports, at a free end portion thereof, the component mounting head; and a swinging device which swings the swingable arm to the component receiving position where the component mounting head is aligned with the component-supply portion of the supplying device in the Z direction and to the component mounting position where the component mounting head is aligned in the Z direction with the component-fix place on the printed circuit board supported by the printed-circuit-board supporting device.

15. The system according to claim 14, wherein the swingable arm supports, at the free end portion thereof, the component mounting head and allows the component mounting head to be moved relative to the swingable arm in the Z direction, and wherein the electronic-component mounting device further comprises a Z-direction moving device which moves the component mounting head relative to the swingable arm in the Z direction.

16. An electronic-component mounting system, comprising:
a printed-circuit-board supporting device which positions and supports a printed circuit board;
an X-Y table which is movable, relative to the printed-circuit-board supporting device, in each of an X direction and Y direction which are perpendicular to each other and cooperate with each other to define an X-Y plane parallel to a board-support plane on which the printed circuit board is supported by the supporting device;
an electronic-component supplying device which is mounted on the X-Y table and which includes a component-supply portion from which electronic components are supplied one by one;
an electronic-component mounting device which is mounted on the X-Y table together with the electronic-component supplying device and which comprises a component mounting head which receives at a component receiving position the electronic components one by one from the component-supply portion of the electronic-component supplying device and mounts at a component mounting position at least one of the electronic components on the printed circuit board positioned and supported on the board-support plane by the printed-circuit-board supporting device, the electronic-component mounting device further comprising a head moving device which is mounted on the X-Y table and is connected to the component mounting head and which moves the mounting head relative to the X-Y table to the component receiving position and to the component mounting position, the component receiving position and the component mounting position being distant from each other in one of the X and Y directions;
a manual X-Y table moving device which is connected to the X-Y table and which is manually operated to move the X-Y table in said each of the X and Y directions; and
a clamper which clamps the X-Y table relative to a bed, wherein the X-Y table comprises an X-direction slider which is movable in the X-direction relative to the bed; the clamper comprises an X-direction clamper which clamps the X-direction slider relative to the bed; the X-Y table further comprises a Y-direction slider which is movable in the Y-direction relative to the X-direction slider; and the damper further comprises a Y-direction damper which clamps the Y-direction slider relative to the X-direction slider.

17. The system according to claim 16, wherein the X-Y table moving device comprises an X-direction nut which is supported by one of the X-direction slider and the bed; a manually rotatable X-direction feeding screw which is supported by an other of the X-direction slider and the bed and which is threadedly engaged with the X-direction nut to move the X-direction slider in the X direction by rotation of the X-direction feeding screw relative to the X-direction nut; a Y-direction nut which is supported by one of the manually rotatable Y-direction and X-direction sliders; and a Y-direction feeding screw which is supported by an other of the Y-direction and X-direction sliders and which is threadedly engaged with the Y-direction nut to move the Y-direction slider in the Y direction by rotation of the Y-direction feeding screw relative to the Y-direction nut.

18. The system according to claim 17, wherein the manually rotatable X-direction feeding screw is supported by the bed, is manually rotatable relative to the X-direction nut and is immovable in an axial direction thereof parallel to an axis line thereof about which the X-direction feeding screw is rotatable, and wherein the manually rotatable Y-direction feeding screw is supported by the X-direction slider, is manually rotatable relative to the Y-direction nut and is immovable in an axial direction thereof parallel to an axis line thereof about which the Y-direction feeding screw is rotatable.

19. An electronic-component mounting system, comprising:

a printed-circuit-board supporting device which positions and supports a printed circuit board;

a movable table which is movable, relative to the printed-circuit-board supporting device, in at least one of an X direction and Y direction which are perpendicular to each other and cooperate with each other to define an X-Y plane parallel to a board-support plane on which the printed circuit board is supported by the supporting device;

an electronic-component supplying device which is mounted on the movable table and which includes a component-supply portion from which electronic components are supplied one by one;

an electronic-component mounting device which is mounted on the movable table together with the electronic-component supplying device and which comprises a component mounting head which receives at a component receiving position the electronic components one by one from the component-supply portion of the electronic-component supplying device and mounts at a component mounting position at least one of the electronic components on the printed circuit board positioned and supported on the board-support plane by the printed-circuit-board supporting device, the electronic-component mounting device further comprising a head moving device which is mounted on the movable table and is connected to the component mounting head and which moves the mounting head relative to the movable table to the component receiving position and to the component mounting position, the component receiving position and the component mounting position being distant from each other in said one of the X and Y directions;

a manual table moving device which is connected to the movable table and which is manually operated to move the movable table in said one of the X and Y directions; and a clamper which clamps the movable table relative to a bed.

20. The system according to claim 19, wherein the manual table moving device comprises a nut which is supported by one of the movable table and the bed; and a manually rotatable feeding screw which is supported by an other of the movable table and the bed, is threadedly engaged with the nut, and is manually rotatable relative to the nut to move the movable table in said at least one of the X and Y directions.

21. An electronic-component mounting system, comprising:

a printed-circuit-board supporting device which positions and supports a printed circuit board;

a movable table which is movable, relative to the printed-circuit-board supporting device, in at least one of an X direction and Y direction which are perpendicular to each other and cooperate with each other to define an X-Y plane parallel to a board-support plane on which the printed circuit board is supported by the supporting device;

an electronic-component supplying device which is mounted on the movable table and which includes a component-supply portion from which electronic components are supplied one by one;

an electronic-component mounting device which is mounted on the movable table together with the electronic-component supplying device and which comprises a component mounting head which receives at a component receiving position the electronic components one by one from the component-supply portion of the electronic-component supplying device and mounts at a component mounting position at least one of the electronic components on the printed circuit board positioned and supported on the board-support plane by the printed-circuit-board supporting device, the electronic-component mounting device further comprising a head moving device which is mounted on the movable table and is connected to the component mounting head and which moves the mounting head relative to the movable table to the component receiving position and to the component mounting position, the component receiving position and the component mounting position being distant from each other in said one of the X and Y directions; and a manual table moving device which is connected to the movable table and which is manually operated to move the movable table in said one of the X and Y directions, wherein the printed-circuit-board supporting device comprises a board conveying device which conveys the printed circuit board through a board conveying route perpendicular to said one of the X and Y directions.

* * * * *